(12) United States Patent
Komatsuda

(10) Patent No.: US 7,023,953 B2
(45) Date of Patent: *Apr. 4, 2006

(54) ILLUMINATION SYSTEM AND EXPOSURE APPARATUS AND METHOD

(75) Inventor: Hideki Komatsuda, Kawasaki (JP)

(73) Assignee: Nikon Corporation, Tokyo (JP)

( * ) Notice: Subject to any disclaimer, the term of this patent is extended or adjusted under 35 U.S.C. 154(b) by 223 days.

This patent is subject to a terminal disclaimer.

(21) Appl. No.: 10/687,770

(22) Filed: Oct. 20, 2003

(65) Prior Publication Data

US 2004/0084632 A1 May 6, 2004

Related U.S. Application Data

(62) Division of application No. 10/208,033, filed on Jul. 31, 2002, now Pat. No. 6,665,051, which is a division of application No. 09/259,137, filed on Feb. 26, 1999, now Pat. No. 6,452,661.

(30) Foreign Application Priority Data

| Feb. 27, 1998 | (JP) | ............................................ 10-047400 |
| Sep. 14, 1998 | (JP) | ............................................ 10-260170 |
| Sep. 17, 1998 | (JP) | ............................................ 10-263673 |

(51) Int. Cl.
*G21K 5/00* (2006.01)

(52) U.S. Cl. .............................. 378/34; 378/43; 355/53; 355/67

(58) Field of Classification Search .................... 353/99; 355/53, 67, 71, 77; 378/34, 43, 84; 430/296, 430/311, 942; 250/492.1, 492.2, 548, 201.4

See application file for complete search history.

(56) References Cited

U.S. PATENT DOCUMENTS

| 1,333,304 A | 2/1920 | Page |
| 1,342,894 A | 6/1920 | Bugbee |
| 1,633,228 A | 6/1927 | Rogers |
| 1,762,932 A | 6/1930 | Mihalyi |

(Continued)

FOREIGN PATENT DOCUMENTS

| EP | 0 744 641 A2 | 11/1996 |
| EP | 1 024 408 A2 | 8/2000 |
| GB | 741246 | 11/1955 |
| GB | 818229 | 8/1959 |

(Continued)

OTHER PUBLICATIONS

Journal of the Optical Society of America, vol. 62, No. 12, Dec. 1972, "Formulation of a Reflector–Design Problem for a Lighting Fixture", J.S. Schruben, pp. 1498–1501.

(Continued)

*Primary Examiner*—John R. Lee
*Assistant Examiner*—David A. Vanore
(74) *Attorney, Agent, or Firm*—Oliff & Berridge PLC

(57) ABSTRACT

An optical apparatus and method guide EUV radiation to a predetermined surface. A radiation source supplies EUV radiation having a certain dispersion angle. An illumination optical system having a reflective integrator forms a secondary radiation source having a predetermined shape based on the EUV radiation supplied from the radiation source. A projection optical system is arranged in an optical path between a reflective mask and the predetermined surface and forms an image of the reflective mask onto the predetermined surface based on the EUV radiation from the reflective mask. The secondary radiation source having the predetermined shape has a shape that is a substantially circular shape, an annular shape, or a multipolar shape.

20 Claims, 23 Drawing Sheets

U.S. PATENT DOCUMENTS

| | | |
|---|---|---|
| 2,183,249 A | 12/1939 | Schering et al. |
| 2,186,123 A | 1/1940 | Rantsch et al. |
| 2,195,184 A | 3/1940 | Mobarry |
| 2,202,061 A | 5/1940 | Mobarry et al. |
| 2,225,485 A | 12/1940 | Rantsch |
| 2,238,008 A | 4/1941 | Beck et al. |
| 2,270,517 A | 1/1942 | Drucker |
| 2,326,970 A | 8/1943 | Rantsch |
| 2,552,185 A | 5/1951 | Koch |
| 2,803,163 A | 8/1957 | Ulffers |
| 2,991,691 A | 7/1961 | Schering |
| 3,166,625 A | 1/1965 | Brumley |
| 3,267,802 A | 8/1966 | Noble |
| 3,296,923 A | 1/1967 | Miles |
| 3,555,987 A | 1/1971 | Browning |
| 3,941,475 A | 3/1976 | Sheets |
| 4,475,027 A | 10/1984 | Pressley |
| 4,497,015 A | 1/1985 | Konno et al. |
| 4,682,885 A | 7/1987 | Torigoe |
| 4,701,023 A | 10/1987 | Hager et al. |
| 4,734,829 A | 3/1988 | Wu et al. |
| 4,769,750 A | 9/1988 | Matsumoto et al. |
| 4,884,869 A | 12/1989 | Uemura |
| 4,931,830 A | 6/1990 | Suwa et al. |
| 5,098,184 A | 3/1992 | van den Brandt et al. |
| 5,237,367 A | 8/1993 | Kudo |
| 5,245,384 A | 9/1993 | Mori |
| 5,315,629 A | 5/1994 | Jewell et al. |
| 5,339,346 A | 8/1994 | White |
| 5,361,292 A | 11/1994 | Sweatt |
| 5,440,423 A | 8/1995 | Ogura |
| 5,459,547 A | 10/1995 | Shiozawa |
| 5,512,759 A | 4/1996 | Sweatt |
| 5,534,970 A | 7/1996 | Nakashima et al. |
| 5,581,605 A | 12/1996 | Murakami et al. |
| 5,594,526 A | 1/1997 | Mori et al. |
| 5,631,721 A | 5/1997 | Stanton et al. |
| 5,669,708 A | 9/1997 | Mashima et al. |
| 5,677,939 A | 10/1997 | Oshino |
| 5,684,566 A | 11/1997 | Stanton |
| 5,703,675 A | 12/1997 | Hirukawa et al. |
| 5,724,122 A | 3/1998 | Oskotsky |
| 5,737,137 A | 4/1998 | Cohen et al. |
| 5,739,899 A | 4/1998 | Nishi et al. |
| 5,760,963 A | 6/1998 | Mori |
| 5,815,310 A | 9/1998 | Williamson |
| 5,864,388 A | 1/1999 | Shima et al. |
| 5,891,806 A | 4/1999 | Shibuya et al. |
| 5,894,341 A | 4/1999 | Nishi et al. |
| 5,896,438 A | 4/1999 | Miyake et al. |
| 5,920,380 A | 7/1999 | Sweatt |
| 6,195,201 B1 | 2/2001 | Koch et al. |
| 6,198,793 B1 | 3/2001 | Schultz et al. |
| 6,231,198 B1 | 5/2001 | Foo |
| 6,249,382 B1 | 6/2001 | Komatsuda |
| 6,266,389 B1 * | 7/2001 | Murayama et al. ............ 378/34 |
| 6,281,967 B1 | 8/2001 | Kudo |
| 6,295,122 B1 | 9/2001 | Schultz et al. |
| 6,480,262 B1 | 11/2002 | Tanaka et al. |
| 6,573,978 B1 * | 6/2003 | McGuire, Jr. ................. 355/71 |
| 6,704,095 B1 | 3/2004 | Schultz |
| 2001/0012101 A1 | 8/2001 | Mulkens |
| 2001/0043408 A1 | 11/2001 | Wangler et al. |

FOREIGN PATENT DOCUMENTS

| | | |
|---|---|---|
| JP | A-56-81813 | 7/1981 |
| JP | A-60-232552 | 11/1985 |
| JP | A-62-2540 | 1/1987 |
| JP | A-5-100097 | 4/1993 |
| JP | A-9-326352 | 12/1997 |

OTHER PUBLICATIONS

"Computer–Aided Optical Design of Illuminating and Irradiating Devices", O. Kusch, ASLAN Publishing House, Moscow 1993, Chapter 3, pp. 145–173.

Applied Optics, vol. 35, No. 10, Apr. 1996, "Tailored reflectors for illumination", D, Jenkins et al., pp. 1669–1672.

* cited by examiner

ILLUMINATION SYSTEM AND EXPOSURE APPARATUS AND METHOD

This is a Division of application Ser. No. 10/208,033 filed Jul. 31, 2002, now U.S. Pat. No. 6,665,051, which in turn is a Divisional of application Ser. No. 09/259,137 filed Feb. 26, 1999, now U.S. Pat. No. 6,452,661. The entire disclosure of the prior applications is hereby incorporated by reference herein in their entirety.

FIELD OF THE INVENTION

The present invention relates to an illumination system capable of providing uniform illumination, and more particularly relates to an exposure apparatus incorporating the illumination system, and a semiconductor device manufacturing method using same.

BACKGROUND OF THE INVENTION

Conventional exposure apparatus for manufacturing semiconductor devices include an illumination system for illuminating a circuit pattern formed on a mask and projecting this pattern through a projection optical system onto a photosensitive substrate (e.g., a wafer) coated with photosensitive material (e.g., photoresist). One type of projection optical system employs an off-axis field (e.g., an arcuate field) and projects and transfers only a portion of the mask circuit pattern onto the wafer if the exposure were static. An exemplary projection optical system having such a field comprises two reflecting mirrors, a concave mirror and a convex mirror. In such projection optical systems, transfer of the entire mask circuit pattern onto the wafer is performed dynamically by simultaneously scanning the mask and wafer in a fixed direction.

Scanning exposure has the advantage in that a high resolving power is obtained with a comparatively high throughput. In scanning-type exposure apparatus, an illumination system capable of uniformly illuminating with a fixed numerical aperture (NA) the entire arcuate field on the mask is highly desirable. Such an illumination system is disclosed in Japanese Patent Application Kokai No. Sho 60-232552. With reference to FIG. 1, an illumination system 10, disclosed therein, comprises, along an optical axis A, an ultrahigh-pressure mercury lamp 12, an elliptical mirror 14, and an optical integrator 16. With reference now also to FIG. 2, optical integrator 16 has an incident surface 16$i$, an exit surface 16$e$, and comprises a combination of four segmented cylindrical lenses 16$a$–16$d$. Lenses 16$a$ and 16$d$ are located at the respective ends of optical integrator 16, are oriented in the same direction, and have a focal length f1. Lenses 16$b$ and 16$c$ are located between lenses 16$a$ and 16$d$ and are each oriented in the same direction, which is substantially perpendicular to the orientation of lenses 16$a$ and 16$d$.

Adjacent optical integrator 16 is a first condenser optical system 18 and a slit plate 20. With reference now also to FIG. 3, the latter includes an arcuate aperture 20A having a width 20W and a cord 20C. Adjacent slit plate 20 is a condenser optical system 22 and a mask 24.

Mercury lamp 12 generates a light beam 26 which is condensed by elliptical mirror 14 onto incident surface 16$i$ of optical integrator 16. By virtue of having two different focal lengths, optical integrator 16 causes light beam 26, passing therethrough, to have different numerical apertures in orthogonal directions to the beam (e.g., in the plane and out of the plane of the paper, as viewed in FIG. 1). Light beam 26 is then condensed by condenser optical system 18 and illuminates slit plate 20 and arcuate aperture 20A. Light beam 26 then passes therethrough and is incident condenser optical system 22, which condenses the light beam to uniformly illuminate a portion of mask 24.

With continuing reference to FIG. 3, a rectangular-shaped region 28 on slit plate 20 is illuminated so that at least arcuate aperture 20A is irradiated. Thus, light beam 26 is transformed from a rectangular cross-section beam to an arcuate illumination beam, corresponding to aperture 20A. Note that aperture 20A passes only a small part of the beam incident slit plate 20.

Generally, arcuate cord 20C is made long to increase the size of the exposure field on the wafer. In addition, arcuate slit width 20W is set comparatively narrow to correspond to the corrected region of the projection optical system used in combination with illumination system 10. The illumination efficiency is determined by the ratio of surface area of arcuate aperture 20A to rectangular-shaped region 28. This ratio is small for illumination system 10, an indication that the system is very inefficient, which is disadvantageous. As a result, the amount of light reaching mask 24 is fixed at a relatively low level. Since the time of exposure of mask 24 is inversely proportional to the amount of light (i.e., intensity) at the mask (i.e., the more intense the light, the shorter the exposure time), the scanning speed of the mask is limited. This limits the exposure apparatus' ability to process an increasingly large number of wafers (e.g., to increase throughput).

SUMMARY OF THE INVENTION

The present invention relates to an illumination system capable of providing uniform illumination, and more particularly relates to an exposure apparatus incorporating the illumination system, and a semiconductor device manufacturing method using same.

Accordingly, the present invention has the goals of providing an illumination system capable of supporting higher throughput with an illumination efficiency markedly higher than heretofore obtained. Another goal is to maintain uniform illumination (e.g., uniform Köhler illumination).

There has been a strong desire in recent years for a next-generation exposure apparatus capable of projecting and exposing a pattern having a much finer line width onto a photosensitive substrate by using a light source, such as a synchrotron, that supplies soft X-rays. However, prior art illumination systems are not capable of efficiently and uniformly illuminating a mask with X-ray wavelength light ("X-rays").

Consequently, the present invention has the further goal of supplying an illumination system and exposure apparatus capable of efficiently and uniformly illuminating a mask with X-rays, and further to provide a method for manufacturing semiconductor devices using X-rays.

Accordingly, a first aspect of the invention is an illumination system for illuminating a surface over an illumination field having an arcuate shape. The system comprises a light source for providing a light beam and an optical integrator. The optical integrator includes a first reflective element group having an array of first optical elements each having an arcuate profile corresponding to the arcuate shape of the illumination field. Each first optical element also includes an eccentric reflecting surface comprising an off-axis section of a spherical reflecting surface or an off-axis section of an aspherical reflecting surface. The array of first optical elements is designed so as to form a plurality of arcuate light beams capable of forming multiple light source images. The illumination system further includes a condenser optical system designed so as to condense the plurality of arcuate light beams to illuminate the surface over the arcuate illumination field in an overlapping manner.

A second aspect of the invention is the illumination system as described above, wherein the condenser optical system comprises a condenser mirror with a focal point, with the condenser mirror arranged such that the focal point substantially coincides with the surface to be illuminated.

A third aspect of the invention is an illumination optical system as described above, further comprising a second reflective element group having a plurality of second optical elements. Each of the second optical elements has a rectangular shape and a predetermined second reflecting curved surface which is preferably an on-axis section of a spherical or aspherical reflective surface. The first and second reflecting element groups are opposingly arranged such that the multiple light source images are formed at the plurality of second optical elements when the light beam is incident the first reflecting element group.

A fourth aspect of the invention is an exposure apparatus for exposing the image of a mask onto a photosensitive substrate. The apparatus comprises the illumination system as described above, a mask stage capable of supporting the mask, and a substrate stage capable of supporting the photosensitive substrate. A projection optical system is arranged between the mask stage and the substrate stage, and is designed so as to project a predetermined pattern formed on the mask onto the photosensitive substrate over an arcuate image field corresponding to the arcuate illumination field.

A fifth aspect of the invention is an exposure apparatus as described above, and further including drive apparatus designed so as to synchronously move the mask stage and the wafer stage relative to the projection optical system.

A sixth aspect of the invention is the exposure apparatus as described above, wherein the illumination system includes a first variable aperture stop having a first variable diameter. The projection optical system further includes a second variable aperture stop having a second variable diameter. First and second drive systems are operatively connected to the first and second variable aperture stops, respectively, so as to change the first and second variable diameters, respectively. A control apparatus is also preferably included. The control apparatus is electrically connected to the first and second drive units so as to control the coherence factor by varying the first and second variable aperture diameters.

A seventh aspect of the invention is a method of patterning the surface of a photosensitive substrate with a pattern on a mask in the manufacturing of a semiconductor device. The method comprising the steps of first, providing an illumination light beam. The next (i.e., second) step is reflectively dividing the illumination light beam into a plurality of arcuate light beams corresponding to an arcuately shaped illumination field. The next step is condensing the arcuate light beams onto the mask over the arcuately shaped illumination field. The final step is projecting light from the mask onto the photosensitive substrate. The present method preferably further includes the steps in the above-mentioned second step, of first reflecting the light beam from a first array of reflecting elements each having an arcuate shape and a reflecting surface having an eccentric curvature, and forming a plurality of light source images, and then second, reflecting light from the plurality of light source images with a second array of reflecting elements opposingly arranged relative to the first array of reflecting elements.

DETAILED DESCRIPTION OF THE INVENTION

The present invention relates to an illumination system capable of providing uniform illumination, and more particularly relates to an exposure apparatus incorporating the illumination system, and a semiconductor device manufacturing method using same.

Figure 1:
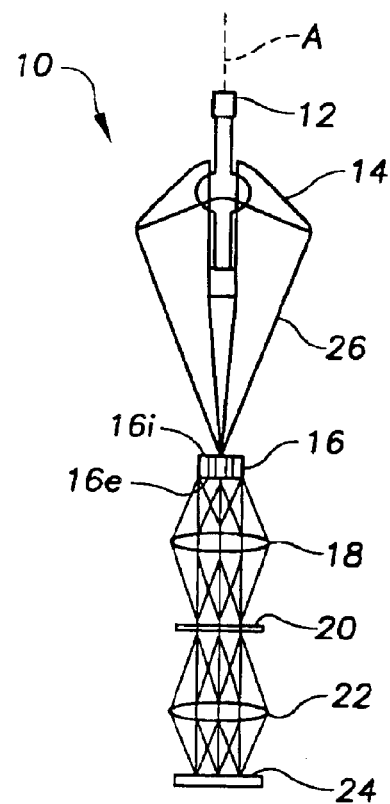
FIG. 1 is a schematic optical diagram of a prior art illumination system.
Figure 2:
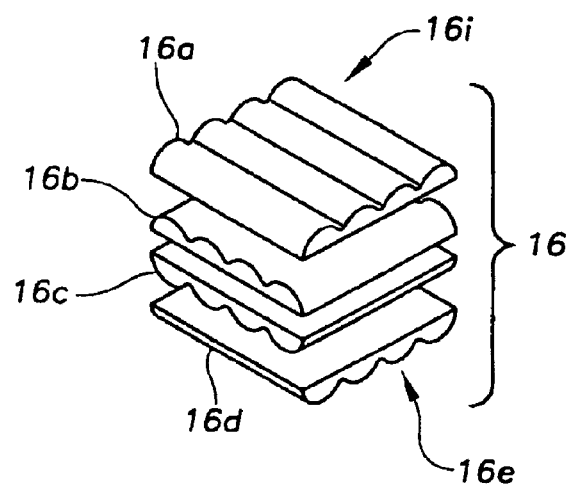
FIG. 2 is a close-up perspective view of the optical integrator of the prior art illumination system of FIG. 1.
Figure 3:
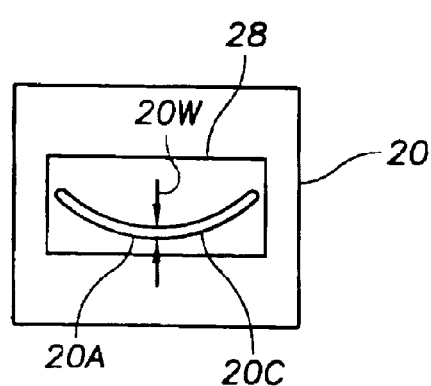
FIG. 3 is a top view of the slit aperture of the prior art illumination system of FIG. 1, with the rectangular illumination region superimposed.
Figure 4:
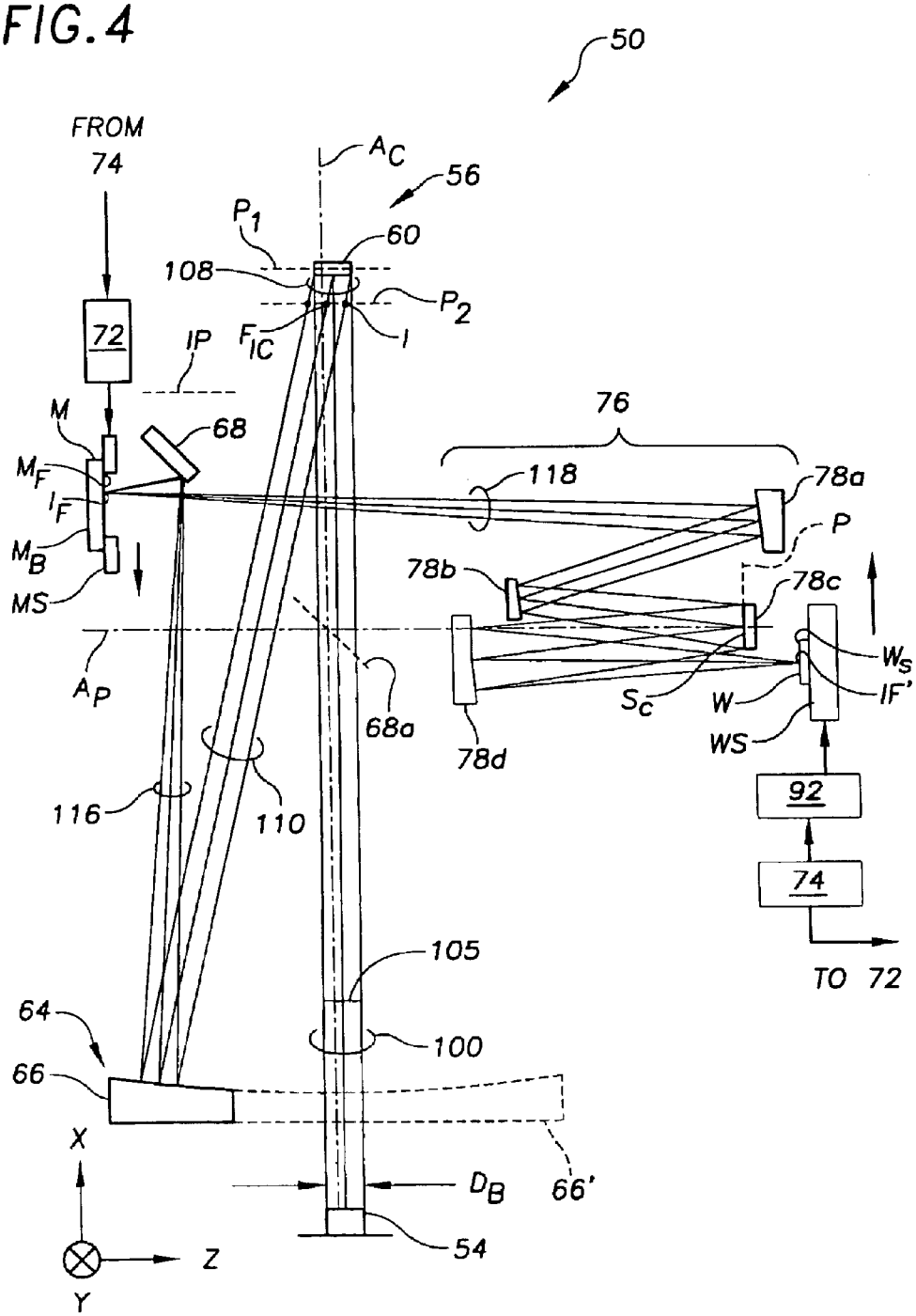
FIG. 4 is a schematic diagram of the exposure apparatus according to a first embodiment of the present invention.
Figure 5:
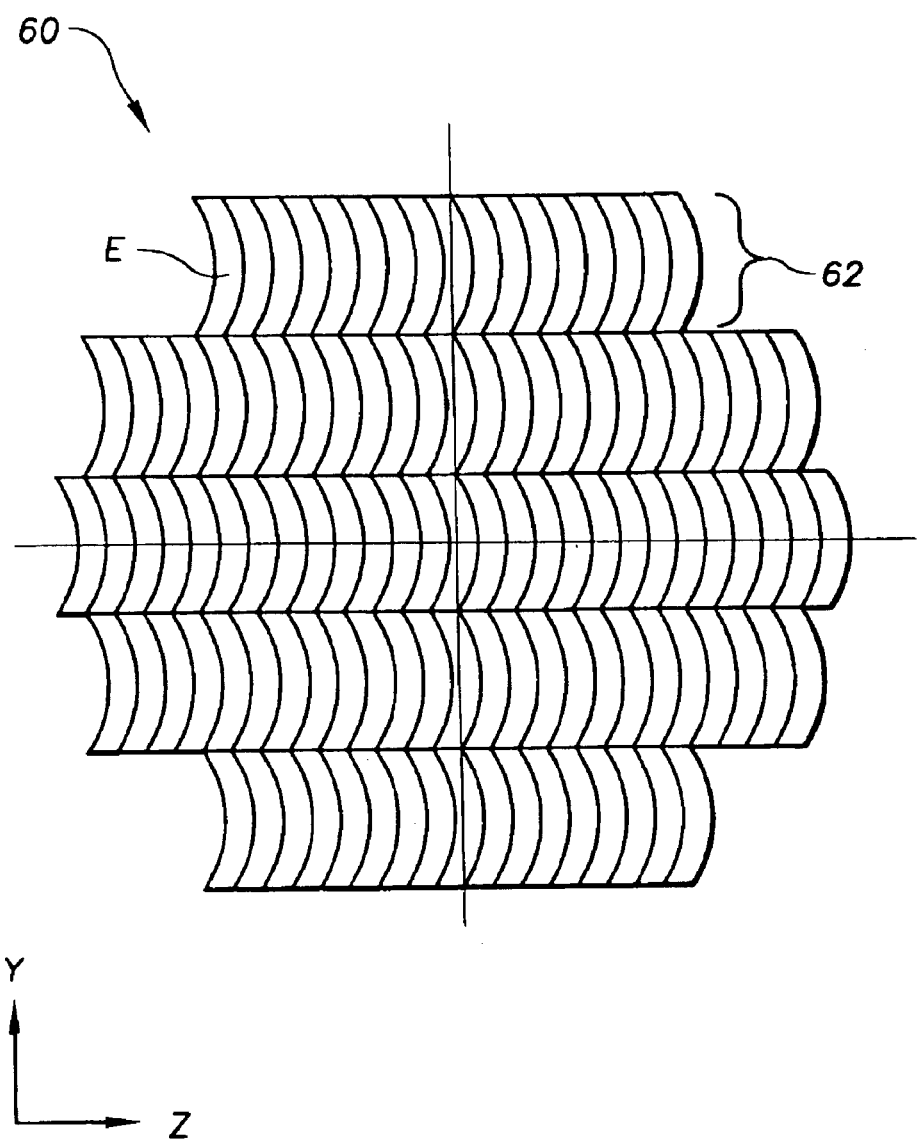
FIG. 5 is a front view of the reflecting element group shown in FIG. 4.

With reference to FIGS. 4 and 5, exposure apparatus 50 comprises, along an optical axis $A_C$, a light source 54 which supplies light of wavelength $\lambda < 200$ nm. A preferred light source is a laser, such as an ArF excimer laser supplying light of wavelength $\lambda = 193$ nm, or an $F_2$ laser supplying light of wavelength $\lambda = 157$. Alternatively, light source 54 may be an X-ray radiating apparatus such as a laser plasma X-ray source radiating X-rays of wavelength $\lambda = 10-15$ nm or $\lambda = 5-20$ nm, a synchrotron generating apparatus radiating light of wavelength $\lambda = 10-15$ nm, $\lambda = 5-20$ nm and the like.

Exposure apparatus 50 further comprises an optical integrator (i.e., a multiple light source forming system) 56. Light beam 100 from light source 54 is directed to optical integrator 56. Optical integrator 56 is disposed in a predetermined position to receive light beam 100. Optical integrator 56 comprises a reflecting element group 60 having a plurality of reflecting elements E (FIG. 5) arranged two-dimensionally in dense formation (i.e., in an array) along a predetermined first reference plane $P_1$ parallel to the Y-Z plane. Specifically, as shown in FIG. 5, reflecting elements E have reflecting curved surfaces with an arcuate shape (profile). In a preferred embodiment, reflecting elements E are arranged in a number of columns 62 (e.g., five columns, as shown) arranged along the Y-direction. Each column 62 comprises a plurality of reflecting elements E arranged along the Z-direction. Furthermore, columns 62 are designed such that together they roughly form a circular shape. The arcuate shape of reflecting elements E is similar to the shape of the arcuate illumination field formed on the mask, as discussed further below.

Figure 6:
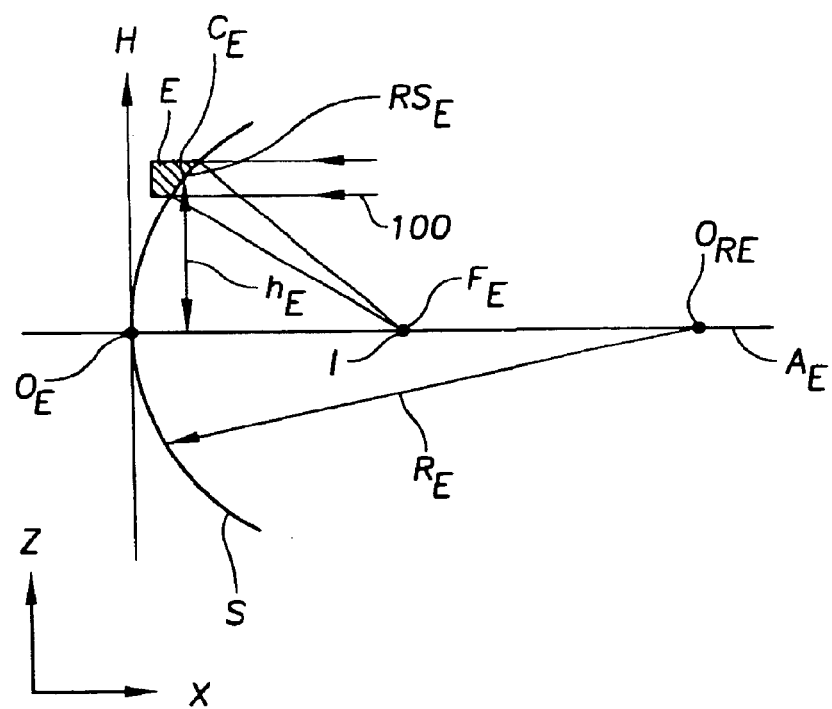
FIG. 6 depicts the X-Z plane geometry associated with the reflecting elements in the reflecting element group of FIG. 5.
Figure 7:
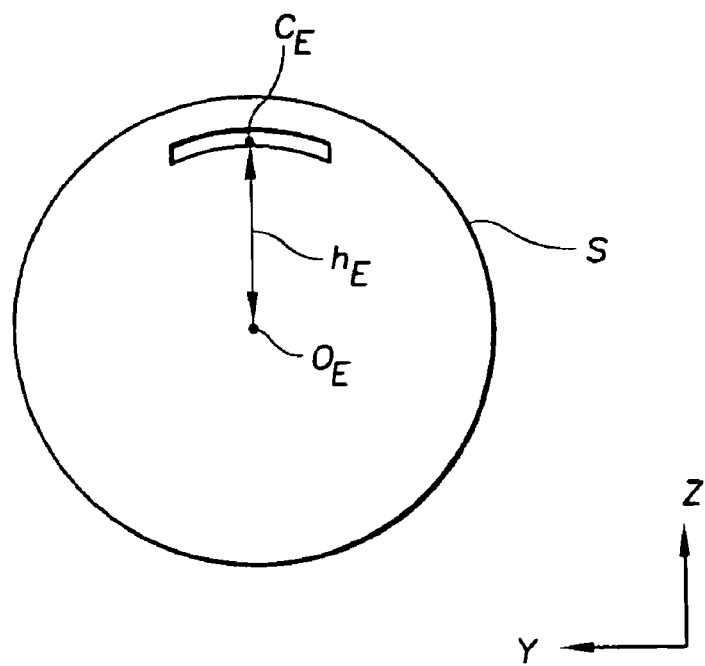
FIG. 7 depicts the Y-Z plane geometry associated with the reflecting elements in the reflecting element group of FIG. 5.

With reference now to FIGS. 6 and 7, each reflecting element E comprises an arcuate section, removed from an optical axis $A_E$, of a reflecting curved surface S of radius of curvature $R_E$. Surface S is centered on optical axis $A_E$ and has an apex $O_E$. Further, arcuate reflecting element E has a center $C_E$ removed from optical axis $A_E$ by a heigh $h_E$. Accordingly, each reflecting element E comprises an eccentric reflecting surface $RS_E$ which is a section of reflecting curved surface S. Reflecting surface $RS_E$ is the effective reflecting region of reflecting element E that reflects light (e.g., light beam 100) from light source 54.

With reference again to FIG. 4, exposure apparatus 50 further comprises a condenser optical system 64 having a condenser mirror 66 removed from optical axis $A_C$. Condenser mirror 66 comprises a section of a spherical mirror 66' (dashed line) centered on optical axis $A_C$ and having a radius of curvature $R_C$ (not shown). Optical axis $A_C$ passes through the center of a plane $P_2$ located on optical axis $A_C$. However, the focal point (not shown) of condenser mirror 66 is located on optical axis $A_C$. The latter is also parallel to each optical axis $A_E$ of plurality of optical elements E in optical element group 60.

Exposure apparatus 50 further comprises a fold mirror 68 for folding the optical path between condenser optical system 64 and a reflective mask M, and a mask stage MS for movably supporting the reflective mask M having a backside $M_B$, and a reflective front side $M_F$ with a pattern (not shown), such as a circuit pattern. Mask stage MS is operatively connected to a mask stage drive system 72 for driving the mask stage in two-dimensional movement in the X-Y plane. A control system 74 is electrically connected to drive system 72 to control its operation.

A projection optical system 76 is disposed in the optical path between reflective mask M and a photosensitive substrate such as wafer W. Projection optical system 76 includes an optical axis $A_P$ and is preferably an off-axis-type reduction system comprising, for example, four aspherical mirrors 78a–78d. The latter have effective reflecting surfaces at positions removed from optical axis $A_P$. Mirrors 78a, 78c and 78d comprise concave aspherical mirrors, and mirror 78b comprises a convex aspherical mirror. A pupil position P is located at a reflecting surface $S_C$ of mirror 78c. An aperture stop (not shown) is provided at pupil position P.

Exposure apparatus 50 further comprises a wafer stage WS for movably supporting a wafer W having a surface $W_S$ coated with a photosensitive material, such as photoresist. Wafer stage WS is connected to a wafer stage drive system 92 for driving the wafer stage in two-dimensional movement in the X-Y plane. Drive system 92 is also electrically connected to control system 74 which controls drive system 92 and also coordinates the relative driving of drive systems 72 and 92.

The operation of exposure apparatus 50 is now described with reference to FIGS. 4 and 6. A light beam 100 having a wavefronts 105 and a beam diameter $D_B$ emanates from light source 54 and travels parallel to optical axis $A_C$ and also parallel to optical axis $A_E$ of reflecting element E (FIG. 6). Light beam 100 then reflects from each reflecting surface $RS_E$ of element E and is condensed at a focal point position $F_E$ (FIG. 6) on optical axis $A_E$. A plurality of light source images I are formed corresponding to each reflecting element E (FIG. 6). If focal length $f_E$ of reflecting element E is equal to the distance between apex $O_E$ and focal point position $F_E$, and $R_E$ is the radius of curvature of the reflecting curved surface S, then the relationship in condition (1) below holds:

$$f_E = -R_E/2. \quad (1)$$

With continuing reference to FIGS. 4 and 6, wavefronts 105 of light beam 100 are incident reflecting element group 60 substantially perpendicular, thereby forming, upon reflection from reflecting elements E, a plurality of converging beams 108 each having an arcuate cross-section (hereinafter, "arcuate light beam"). This results in the formation of plurality of light source images I at plane $P_2$. Light source images I are displaced from incident light beam 100 in direction perpendicular to optical axis $A_E$. The number of light source images I corresponds to the number of reflecting elements E in reflecting element group 60. In other words, assuming light beam 100 is incident reflecting elements E from a direction parallel to each optical axis $A_E$, light source images I are respectively formed in plane $P_2$ through which focal point position $F_E$ passes. In this manner, reflecting element group 60 functions as an optical integrator, i.e., a multiple-light-source forming optical system capable of forming a plurality of secondary light sources.

With continuing reference to FIG. 4, light beams 110 emanating from plurality of light source images I are respectively reflected and condensed by condenser mirror 66, which forms condensed light beams 116. The latter are deflected by deflection (fold) mirror 68 and arcuately illuminate front side $M_F$ of mask M in a superimposed manner.

Figure 8:
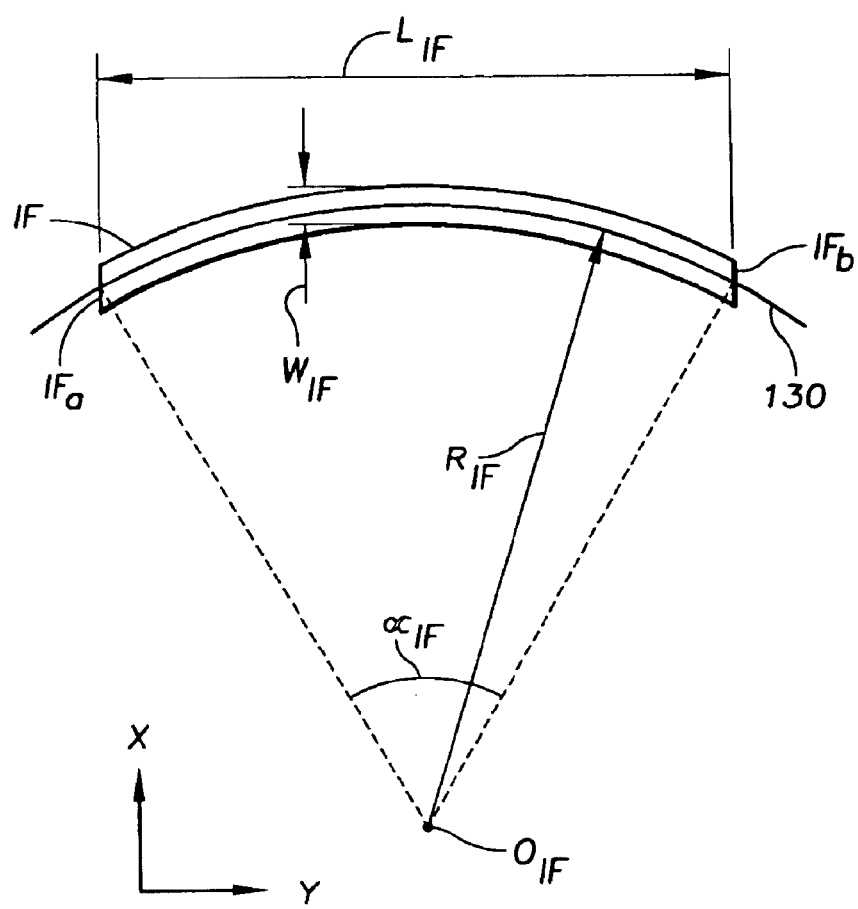
FIG. 8 depicts the X-Y plane geometry associated with the arcuate illumination field formed on the mask in the exposure apparatus of FIG. 14;.

With reference now to FIG. 8, an arcuate illumination field IF, as formed on mask M when viewed from backside $M_B$, has a center of curvature $O_{IF}$ on optical axis $A_P$ of projection optical system 76. If fold mirror 68 were to be removed, arcuate illumination field IF would be formed at position (plane) IP, and center of curvature $O_{IF}$ of arcuate illumination field IF would be located on optical axis $A_C$.

In exposure apparatus 50 of FIG. 4, optical axis $A_C$ is not deflected 90° by a fold mirror. However, if optical axis $A_C$ were so deflected by a hypothetical reflecting surface 68A, optical axis $A_C$ and optical axis $A_P$ would become coaxial and intersect mask M. Consequently, it can be said that optical axes $A_C$ and $A_P$ are optically coaxial. Accordingly, condenser mirror 66 and projection optical system 76 are arranged such that optical axes $A_C$ and $A_P$ optically pass through center of curvature $O_{IF}$ of arcuate illumination field IF.

Light from condensed light beams 116 reflects from front side $M_F$ of mask M, thereby forming a light beam 118 which is incident projection optical system 76. The latter forms an image of the pattern present on mask front side $M_F$ over an arcuate image field IF' on surface $W_S$ of wafer W. Mask stage MS moves two-dimensionally in the X-Y plane via drive system 72, and substrate stage WS moves two-dimensionally in the X-Y plane via drive system 92. Control system 74 controls the drive amount of drive systems 72 and 92. In particular, control system 74 moves mask stage MS and substrate stage WS synchronously in opposite directions (as indicated by arrows) via the two drive systems 72 and 92. This allows for the entire mask pattern to be scanned and exposed onto surface $W_S$ of wafer W through projection optical system 76. In this manner, semiconductor devices can be manufactured, since satisfactory circuit patterns are transferred ("patterned") onto surface $W_S$ of wafer W.

Figure 9:
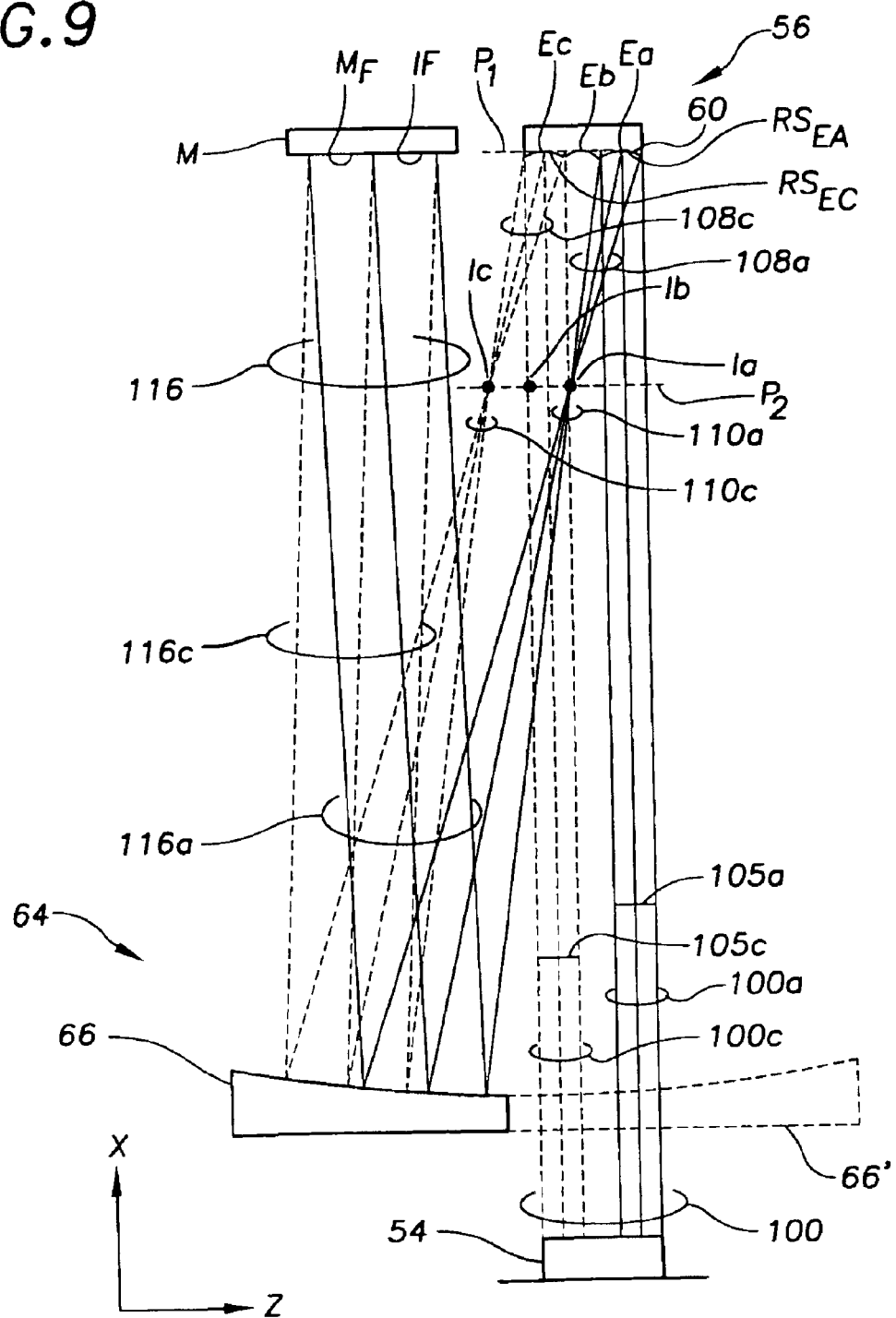
FIG. 9 is a close-up of the exposure apparatus of FIG. 4 showing the reflecting action of the reflecting element group.

The operation of reflecting element group 60 is now explained in greater detail. With reference now to FIG. 9, reflecting element group 60 comprises, for the sake of explanation, three reflecting elements $E_a$–$E_c$ arranged along plane $P_1$ parallel to the Y-Z plane such that the position of the center of curvatures (the focal points) of each reflecting element $E_a$–$E_c$ reside on plane $P_2$.

Light beam 100 comprises collimated light beams 100a and 100c comprising wavefronts 105a and 105c, respectively, that are incident reflecting elements $E_a$ and $E_c$. The latter form, from light beams 100a and 100c, converging arcuate light beams 108a and 108c, respectively, which correspond to the profile shape of reflecting surface $RS_{EA}$ of reflecting element $E_a$ and reflecting surface $RS_{EC}$ of reflecting element $E_c$. Arcuate light beams 108a and 108c converge to form light source images $I_a$ and $I_c$, respectively, at plane $P_2$. Subsequently, diverging light beams 110a and 110c emanate from light source images $I_a$ and $I_c$ and propagate toward condenser mirror 66. The latter condenses light beams 110a and 110c, thereby forming condensed light beams 116a (solid lines) and 116c (dashed lines). Light beams 116a and 116c are condensed by condenser mirror 66 such that they overlap (i.e., are super-imposed) and obliquely illuminate front side $M_F$ of mask M over arcuate illumination field IF. The Z-direction (i.e., the direction in the plane of the paper) along mask front side $M_F$ is the width direction of arcuate illumination field IF.

Thus, light reflects from each reflecting element E in reflecting element group 60 and arcuately illuminates mask M over arcuate illumination field IF in an overlapping (i.e., superimposed) manner, allowing uniform illumination to be achieved. Uniform Köhler illumination is achieved when each light source image I formed by each reflecting element E is re-imaged at pupil position P of projection optical system 76

Even if the entire illumination system (i.e., elements 54 through 68) and projection optical system 76 includes only catoptric members and catoptric elements, an arcuate illumination field IF with uniform illumination intensity can be efficiently formed on mask M while substantially maintaining Köhler illumination.

By making the projective relationship of condenser optical system 64 a positive projection, mask M can be illuminated with a uniform numerical aperture (NA), regardless of illumination direction.

With reference again to FIG. 5, by densely arranging reflecting elements E such that reflecting element group 60 has a roughly circular outline, the outline (profile) of the secondary light sources formed by plurality of light source images I formed at position $P_2$ is also roughly circular. Accordingly, by making the projective relationship of condenser mirror 66 a positive projection and by simultaneously setting the outline (profile) of plurality of light sources I, the spatial coherence inside arcuate illumination field IF formed on mask M can be rendered uniform regardless of the location and direction of incident beams 116 (see FIG. 9).

Furthermore, by configuring the shape of reflecting surface $RS_E$ of each reflecting element E so that the projective relationship is identical to that of condenser mirror 66, the illumination intensity in arcuate illumination field IF can be rendered even more uniform, without generating distortion due to reflecting element group 60 and condenser mirror 66.

With reference again to FIG. 8, an exemplary arcuate illumination field IF has a central arc 130 of radius $R_{IF}$ and an angle $\alpha_{IF}$=60°, ends $IF_a$ and $IF_b$ separated by a linear distance $L_{IF}$=96 mm, a width $W_{IF}$=6 mm, and an illumination numerical aperture NA=0.015 at mask M. Further, the inclination of the principle ray (not shown) of the illumination light with respect to the mask normal (not shown) is approximately 30 mrad (i.e., the entrance pupil position of projection optical system 76 is approximately 3119 mm from mask M), and diameter $D_B$ of light beam 100 from light source 54 is on the order of 42 mm (FIG. 4).

The above description considered reflecting elements E and condenser mirror 66 both with eccentric spherical reflecting surfaces. However, these surfaces can also be aspherical surfaces. Below, specific numerical values for these surfaces as aspherical surfaces are provided.

Figure 10:
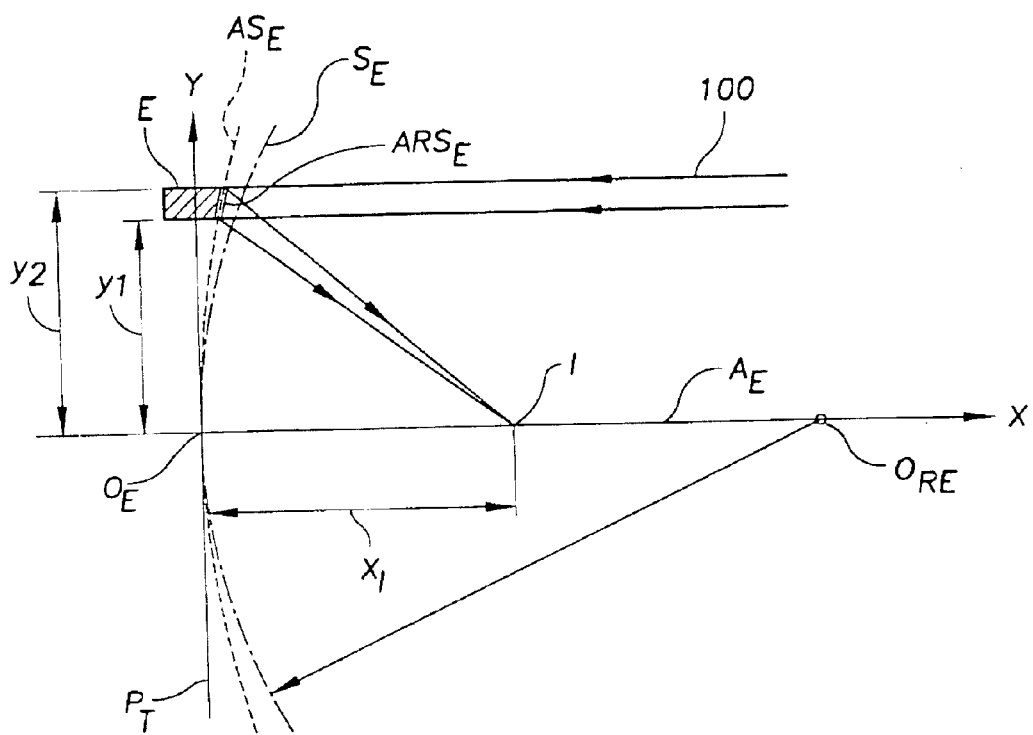
FIG. 10 depicts the X-Y plane geometry associated with a reflecting element in the reflecting element group of FIG. 5 when the reflecting element is aspherical.

With reference now to FIG. 10, reflecting element E includes an arcuate section, removed from optical axis $A_E$, of a reflecting curved aspherical surface $AS_E$ and a reference spherical surface $S_E$ having a common apex $O_E$. Spherical surface $S_E$ has a center of curvature $O_{RE}$. The X-axis passes through apex $O_E$ in the direction perpendicular to a plane $P_T$ tangential at apex $O_E$ (optical axis $A_E$ of reflecting element E is co-linear with the X-axis). The Y-axis passes through apex $O_E$ in the plane of the paper and is perpendicular to the X-axis. The origin of the X-Y coordinate system is apex $O_E$. Accordingly, each reflecting element E comprises an eccentric aspherical reflecting surface $ARS_E$ which is a section of reflecting curved aspherical surface $AS_E$.

Aspherical reflecting surface $AS_E$ is described by the expression for an aspherical surface, below, wherein x(y) is the distance along the direction of the X-axis (optical axis $A_E$) from the tangential plane at apex $O_E$ to the surface $AS_E$, y is the distance along the direction of the Y-axis from the X-axis (optical axis $A_E$) to reflecting surface $AS_E$, $R_E$ is the radius of curvature of reference spherical surface $S_E$, and $C_2$, $C_4$, $C_6$, $C_8$ and $C_{10}$ are aspherical surface coefficients.

$$x(y)=(y^2/R_E)/[1+(1-y^2/R_E^2)^{0.5}]+C_2y^2+C_4y^4+C_6y^6+C_8y^8+C_{10}y^{10}$$

An exemplary aspherical reflecting surface $AS_E$ has the following parameter values:

$R_E$=−183.3211
$C_2$=−5.37852×10$^{-4}$
$C_4$=−4.67282×10$^{-8}$
$C_6$=−2.11339×10$^{-10}$
$C_8$=5.71431×10$^{-12}$
$C_{10}$=−5.18051×10$^{-14}$

Each reflecting element E in reflecting element group 60 has a reflecting cross-sectional shape that interposes heights $y_1$ and $y_2$ from optical axis $A_E$ and comprises an arcuate aspherical eccentric mirror. In an exemplary illumination system 50 illustrated in FIG. 11, length $L_{IF}$ between ends $IF_a$ and $IF_b$ of arcuate illumination field IF at an arc open angle $\alpha_E$ of 60° is approximately 5.25 mm (see FIG. 11), height $y_1$ is approximately 5.085 mm, height y is approximately 5.25 mm, and height $y_2$ is approximately 5.415 mm.

Figure 11:
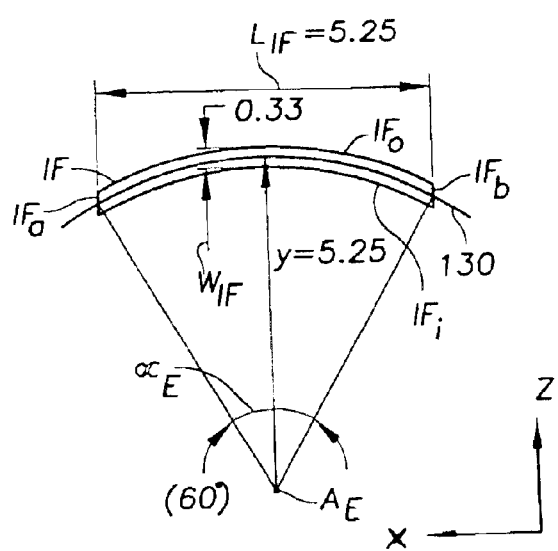
FIG. 11 depicts the Y-Z plane geometry associated with the arcuate illumination field when the reflecting elements are aspherical.

In this case, plurality of light source images I (FIG. 10) formed by reflecting element E are formed at a position axially removed from apex $O_E$ by $X_1$=76.56 mm, with height y=5.25 mm from the center diameter arc 130 (FIG. 11). The position of light source images I in a direction perpendicular to optical axis $A_E$ is removed by $y_1$=5.085 mm from the inner diameter $IF_i$ of arcuate illumination field IF, and is removed by $y_2$=5.415 mm from the outer diameter $IF_o$.

Thus, a satisfactory reflecting element group 60 (FIG. 5) can be constituted by arranging, in columns, a plurality of eccentric aspherical reflecting elements E having the above dimensions.

Next, an exemplary condenser mirror 66 in condenser optical system 64, for the case where reflecting element group 60 comprises a plurality of eccentric aspherical reflecting elements E having the above dimensions, is discussed.

Figure 12:
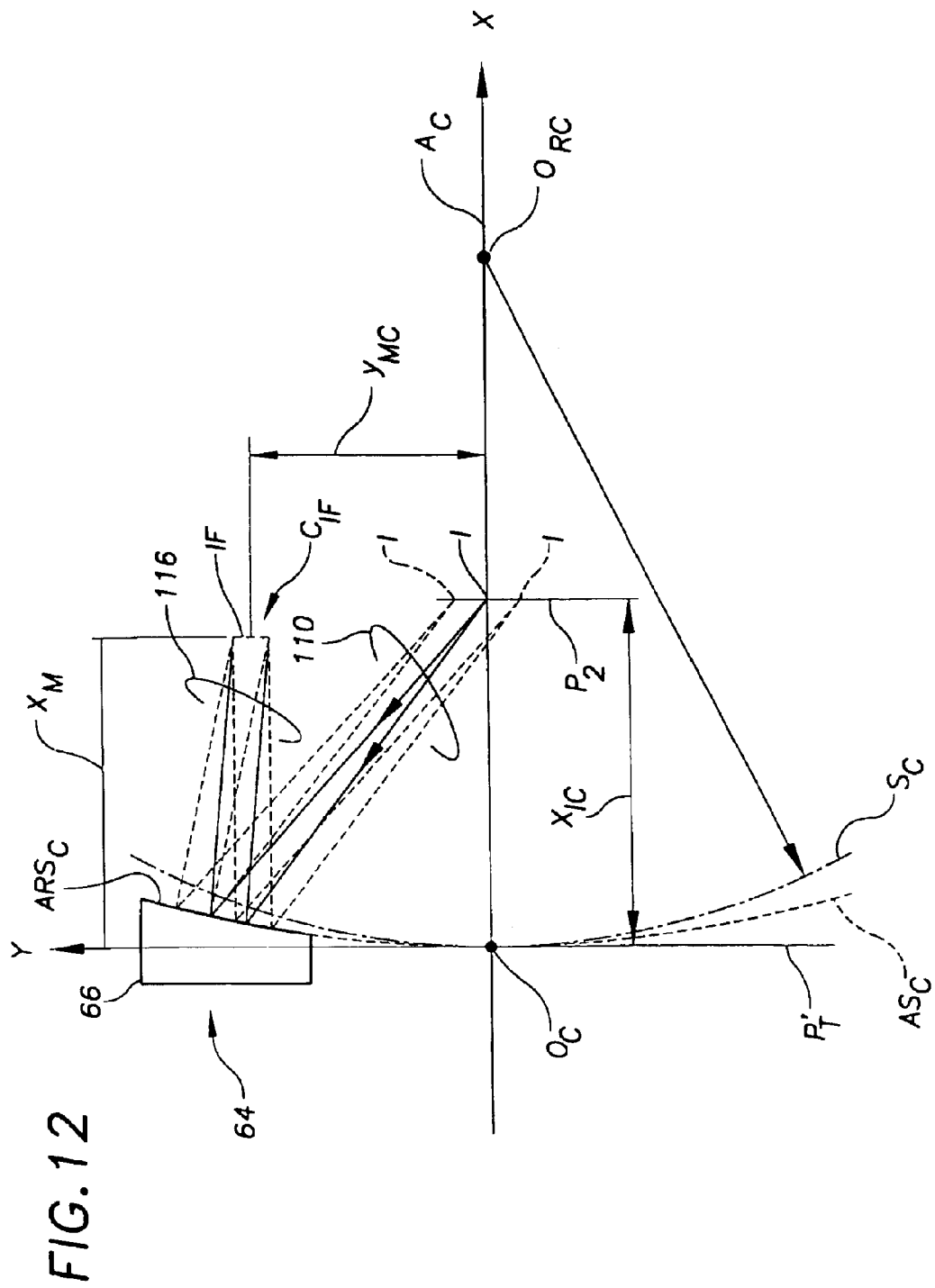
FIG. 12 is a close-up view of the condenser optical system of the exposure apparatus of FIG. 4 with an aspherical condenser mirror showing the reflecting action associated with the creation of secondary light sources.

With reference now to FIG. 12, condenser mirror 66 comprises, in a preferred embodiment, a section $ARS_C$ of reflective an aspherical surface $AS_C$, with associated reference spherical surface $S_C$ having a common apex $O_C$. Reference spherical surface $S_C$ has a center of curvature $O_{RC}$. The X-axis is the direction perpendicular to a tangential plane $P'_T$ at apex $O_C$ (optical axis $A_C$ is the X-axis). The Y-axis is the direction parallel to tangential plane $P'_T$ at apex $O_C$. The origin of the X-Y coordinate system is apex $O_C$.

Reflecting aspherical surface $AS_C$ associated with condenser mirror 66 is described by the expression for an aspherical surface below, wherein x(y) is the distance along the direction of the X-axis (optical axis $A_C$) from tangential plane $P'_T$ at apex $O_C$ to reflecting aspherical surface $AS_C$, y is the distance along the Y-axis from the X-axis (optical axis $A_C$) to reflecting aspherical surface $AS_C$, $R_C$ is the radius of curvature of reference spherical surface $S_C$, and $C_2$, $C_4$, $C_6$, $C_8$ and $C_{10}$ are aspherical surface coefficients.

$$x(y)=(y^2/R_C)/[1+(1-y^2/R_C^2)^{0.5}]+C_2y^2+C_4y^4+C_6y^6+C_8y^8+C_{10}y^{10}$$

Specific numerical values for the present example are as follows:

$R_C$=−3518.74523
$C_2$=−3.64753×10$^{-5}$
$C_4$=−1.71519×10$^{-11}$
$C_6$=1.03873×10$^{-15}$
$C_8$=−3.84891×10$^{-20}$
$C_{10}$=5.12369×10$^{-25}$

With continuing reference to FIG. 12, light source images I formed by reflecting element group 60 are formed in plane $P_2$ orthogonal to optical axis $A_C$ (see FIG. 4). In the present example, plane $P_2$ is at a position removed by approximately $x_{1C}$=2009.8 mm along optical axis $A_C$ from apex $O_C$.

Arcuate illumination field IF having a uniform illumination intensity distribution and spatial coherence is formed by condenser mirror 66 receiving diverging light beams 110 and forming converging light beams 116. Arcuate illumination field IF is formed by condenser mirror 66 at a position $C_{IF}$ removed by $x_M$=1400 mm from apex $O_C$ (or plane $P'_T$) and approximately $y_{MC}$=96 mm from optical axis $A_C$.

By the abovementioned configuration, an arcuate illumination field IF having a uniform illumination intensity and spatial coherence can be formed on mask M.

In a preferred embodiment of the present invention, condition (2) below, is satisfied:

$$0.01 < |f_F/f_C| < 0.5 \qquad (2)$$

wherein $f_F$ is the focal length of each reflecting element E in reflective element group 60 and $f_C$ is the focal length of condenser optical system 64 (e.g., the focal length of condenser mirror 66).

If $|f_F/f_C|$ exceeds the upper limit in condition (2), the focal length $f_C$ of condenser optical system 64 shortens in the extreme when an appropriate power is given to each reflecting element E. Consequently, it is difficult to form a uniform arcuate illumination field IF on mask M, since strong aberrations are generated by condenser optical system 64. On the other hand, if $|f_F/f_C|$ falls below the lower limit in condition (2), the focal length $f_C$ of condenser optical system 64 increases excessively, with the result that the elements in the condenser optical system (e.g., condenser mirror 66) increase in size excessively. This makes it difficult to maintain a compact illumination system when the appropriate power is given to each reflecting element E.

By way of example, for the case where each reflecting element E in reflecting element group 60 has radius of curvature $R_E$=−183.3211 mm, the reference focal length $f_F=91.66055$ mm ($f_F=-R_E/2$). In addition, for a corresponding condenser mirror 66 with a radius of curvature $R_C=-3518.74523$ mm, reference focal length $f_C=1759.3726$ mm ($f_C=-R_C/2$). Accordingly, $$|f_F/f_C|=0.052.$$

Thus, condition (2) is satisfied and an illumination system can be compactly constituted while maintaining a satisfactory illumination region.

The above first mode for carrying out the present invention shows an example wherein optical integrator 56 comprises one reflecting element group 60 (FIG. 4). In a second mode for carrying out the present invention, the optical integrator comprises two reflecting element groups, as described below.

Figure 13:
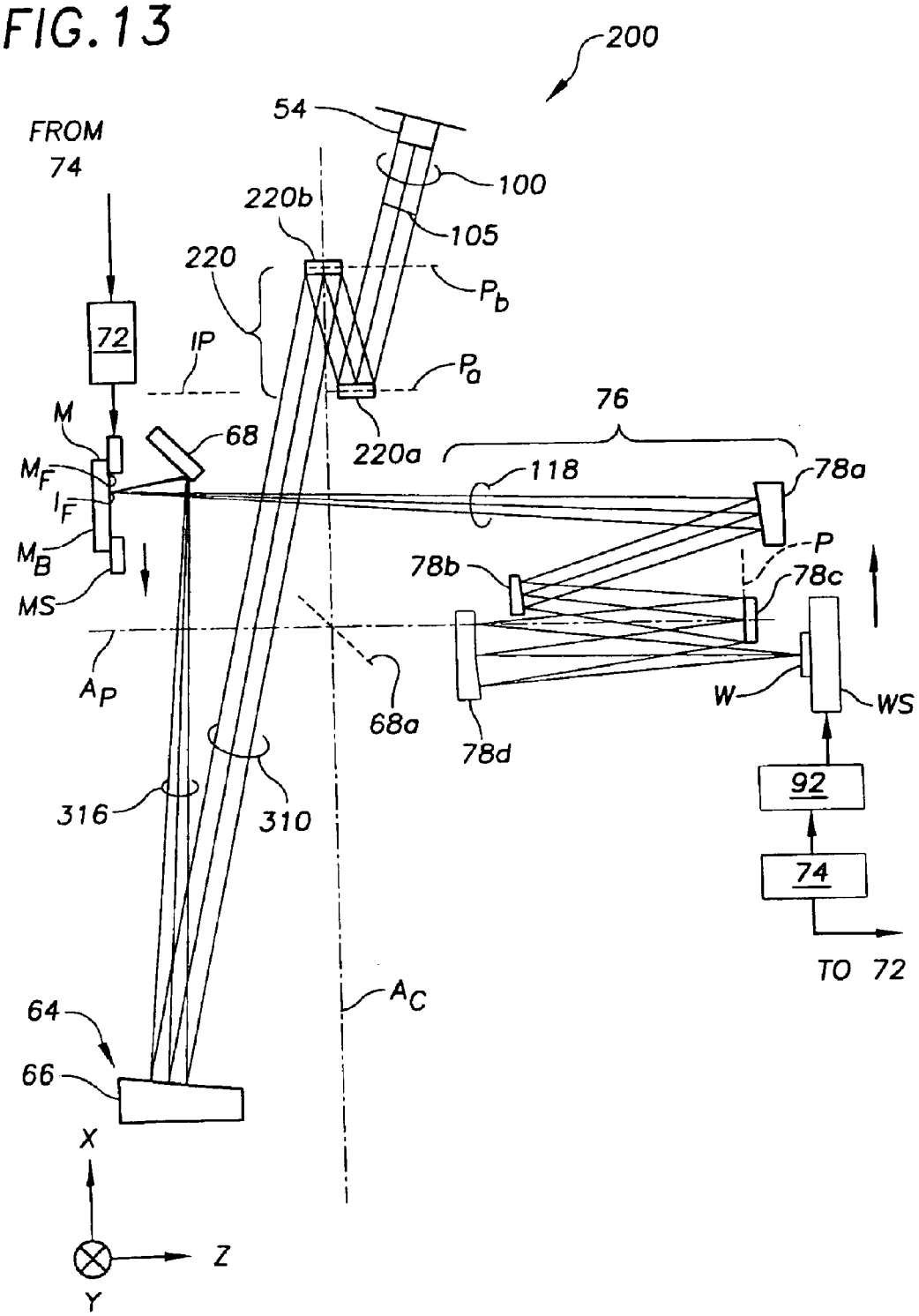
FIG. 13 is a schematic diagram of the exposure apparatus according to a second embodiment of the present invention, which includes an optical integrator having two reflecting element groups.

With reference now to FIG. 13, illumination system 200 comprises essentially the same components as illumination optical system 50 of FIG. 4, except that optical integrator 220, analogous to optical integrator 56 in system 50 of FIG. 4, comprises first and second opposingly arranged reflecting element groups 220a and 220b. First reflecting element group 220a is constituted so that a first plurality of reflecting elements $E_1$ (not shown in FIG. 13) are densely arranged in two dimensions along a predetermined reference plane (first reference plane) $P_a$ parallel to the Y-Z plane. Specifically, with reference to FIG. 14, first reflecting element group 220a includes a plurality of reflecting elements $E_1$, each having an arcuate curved reflecting surface, arranged as described above in connection with elements E of reflecting element group 60.

Figure 16:
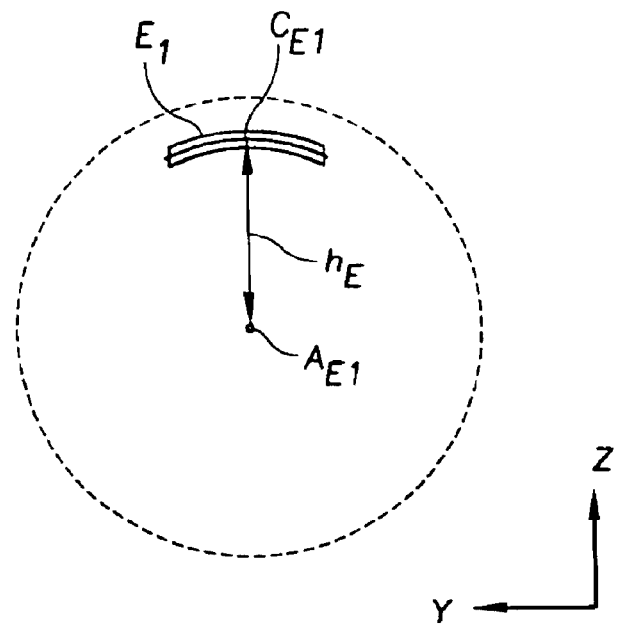
FIG. 16 depicts the geometry in the Y-Z plane associated with the reflecting elements in the first reflecting element group of FIG. 14.
Figure 17:
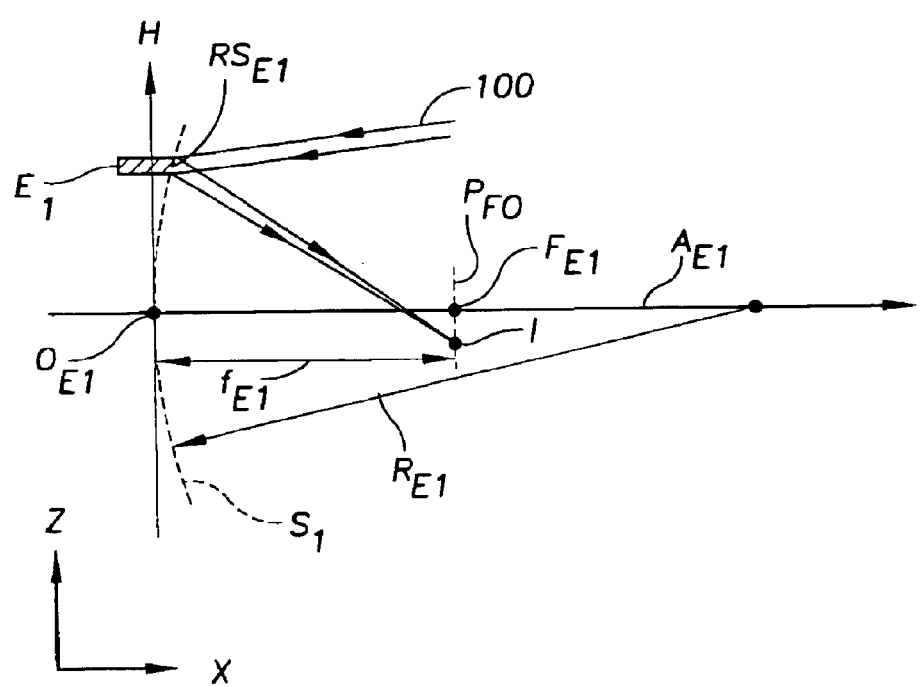
FIG. 17 depicts the geometry in the X-Z plane associated with the reflecting elements in the first reflecting element group of FIG. 14.

With reference now also to FIGS. 16 and 17, each reflecting element $E_1$ in first reflecting element group 220a has an arcuate shape (profile) of one part of a reflecting curved surface $S_1$ of radius of curvature $R_{E1}$ in a region eccentric from optical axis $A_{E1}$. Center $C_{E1}$ of arcuate reflecting element $E_1$ is positioned at height $h_E$ from optical axis $A_{E1}$. Accordingly, the eccentric reflecting surface $RS_{E1}$ of each reflecting element $E_1$, as shown in FIGS. 16 and 17, comprises an eccentric spherical mirror having a radius of curvature $R_{E1}$.

Consequently, with reference to FIG. 17, a portion of light bean 100 impinging from an oblique direction with respect to optical axis $A_{E1}$ is condensed to form a light source image I in plane $P_{FO}$ at a position removed from optical axis $A_{E1}$ in a direction perpendicular to focal point position $F_{E1}$ of reflecting element $E_1$. Reflecting element $E_1$ has a focal length $f_{E1}$, which is the distance between apex $O_{E1}$ and focal point position $F_{E1}$.

In a preferred embodiment of the present invention, condition (3), below, is satisfied:

$$f_{E1}=-R_{E1}/2. \quad (3)$$

With reference again to FIG. 15, second reflecting element group 220b comprises a plurality of second reflecting elements $E_2$ densely arranged in two dimensions along a predetermined reference plane (second reference plane) $P_b$ parallel to the Y-Z plane. Specifically, second reflecting element group 220b includes a plurality of reflecting elements $E_2$ having reflecting curved surfaces which have a rectangular profile (outline). Second reflecting element group 220b has along the Y-direction a plurality of columns 262 (e.g., five, as shown), each comprising a plurality of second reflecting elements $E_2$ arranged in a row along the Z-direction. Furthermore, columns 262 of second reflecting elements are arranged to collectively form a near circular shape (i.e., outline).

In other words, each of second reflecting elements $E_2$ in second reflecting element group 220b is arranged in a row facing, in one-to-one correspondence, each of first reflecting elements $E_1$ comprising first reflecting element group 220a.

Figure 18:
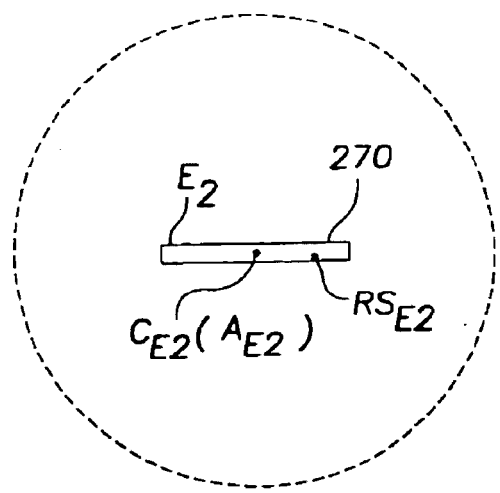
FIG. 18 depicts the geometry associated with the reflecting elements in the second reflecting element group of FIG. 14.
Figure 19:
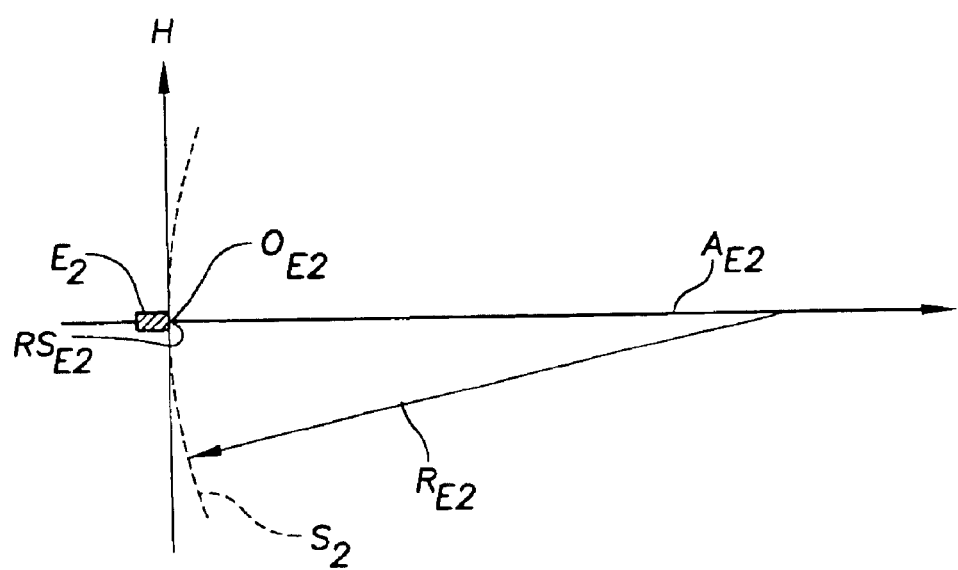
FIG. 19 depicts the geometry associated with the reflecting elements in the second reflecting element group of FIG. 14.

With reference now to FIGS. 18 and 19, each reflecting element $E_2$ has a reflecting surface $RS_{E2}$ having a rectangular profile (outline) that is one part of a reflecting curved surface $S_2$ with a radius of curvature $R_{E2}$ in a region including optical axis $A_{E2}$. Accordingly, reflecting element $E_2$ has a rectangular perimeter 270 and a center $C_{E2}$ which coincides with optical axis $A_{E2}$. Accordingly, reflecting surface $RS_{E2}$ of each reflecting element $E_2$ comprises a concentric spherical mirror with radius of curvature $R_{E2}$.

With reference again to FIG. 13, wavefronts 105 in beam 100 are incident first reflecting element group 220a obliquely from a predetermined direction and are split by the first reflecting element group into arcuately shaped segments by the reflecting action of plurality of reflecting elements $E_1$. The latter form a plurality of light source images I (not shown) at plane (second reference plane) $P_b$, parallel to the Y-Z plane and displaced from incident light beam 100. The number of light source images I corresponds to the number of reflecting elements $E_1$. Second reflecting element group 220b is arranged in plane $P_b$.

Light beam 100 from light source 54, in addition to having a parallel component, also includes a dispersion angle of a certain range. Consequently, each light source image I having a certain size is formed in plane $P_b$ by first reflecting element group 220a. Accordingly, second reflecting element group 220b functions as a field mirror group to effectively utilize light supplied from light source 54. In other words, each of the plurality of second reflecting elements $E_2$ in second reflecting element group 220b functions as a field mirror.

With continuing reference to FIG. 13, plurality of light source images I reflected by second reflecting element group 220b forms a plurality of light beams 310 which are incident condenser mirror 66 with a radius curvature $R_C$. The focal point position (not shown) of condenser mirror 66 coincides with secondary light source plane $P_b$. Center of curvature $O_C$ of condenser mirror 66 exists at the center position of plurality of light source images I formed on second reflecting element group 220b (i.e., the position wherein optical axis $A_C$ and plane $P_b$ intersect, or the center of reflective element group 220b).

Optical axis $A_C$ is parallel to each optical axis $A_{E1}$ associated with each reflecting element $E_1$ in first reflective element group 220a, but is not parallel to each optical axis $A_{E2}$ associated with each reflecting optical element $E_2$ in second reflective element group 220b. More particularly, each optical axis $A_{E2}$ associated with reflecting optical elements $E_2$ is preferably inclined at half the angle of incidence of the obliquely impinging light beam.

With continuing reference to FIG. 13, light beams 310 from plurality of light source images I are each reflected and condensed by condenser mirror 66 thereby forming light beams 316. Light beams 316 are thus made to arcuately illuminate, in a superimposed manner, front side $M_F$ of mask M. Plane mirror 68, as discussed above in connection with apparatus 50 of FIG. 4, may be used as a deflecting mirror to fold the optical path. With reference again also to FIG. 8, arcuate illumination field IF is formed on mask M when viewed from the back side $M_B$ of mask M. Center of curvature $O_{IF}$ of arcuate illumination field IF exists on optical axis $A_P$ (FIG. 13). If plane mirror 68 in system 200 of FIG. 13 is temporarily eliminated, arcuate illumination field IF is formed at plane IP, and center of curvature $O_{IF}$ of arcuate illumination field IF exists on optical axis $A_C$.

With continuing reference to FIG. 13, optical axis $A_C$ of condenser optical system 64 is not deflected 90°. However, if optical axis $A_C$ were deflected 90° by hypothetical reflecting surface 68a, optical axis $A_C$ and optical axis $A_P$ would be coaxial on mask M. Consequently, it can be said that optical axes $A_C$ and $A_P$ are optically coaxial. Accordingly, as with exposure apparatus 50 of FIG. 4, condenser optical system 64 and projection optical system 76 of exposure apparatus 200 are arranged such that optical axes $A_C$ and $A_P$ optically pass through center of curvature $O_{IF}$ of arcuate illumination field IF.

Light beam 118 reflected by front side $M_F$ of mask M passes through projection optical system 76, as described above, thereby forming an image of the mask pattern on surface $W_S$ of wafer W over an arcuate image field IF' (not shown: see FIG. 4). Wafer surface $W_S$ is coated with photoresist and thus serves as a photosensitive substrate onto which the mask pattern, via the arcuately shaped image of mask M, is projected and transferred.

As discussed above in connection with exposure apparatus 50 of FIG. 4, mask stage MS and substrate stage WS move synchronously in opposite directions (as indicated by arrows) via mask stage drive system 72 and wafer stage drive system 92. Drive systems 72 and 92 are controlled by control system 74 in a manner that allows the entire mask pattern on mask M to be scanned and exposed onto wafer surface $W_S$ through projection optical system 76. Consequently, satisfactory semiconductor devices can be manufactured, since satisfactory circuit patterns are transferred onto wafer W by a photolithography process that manufactures semiconductor devices.

Figure 20:
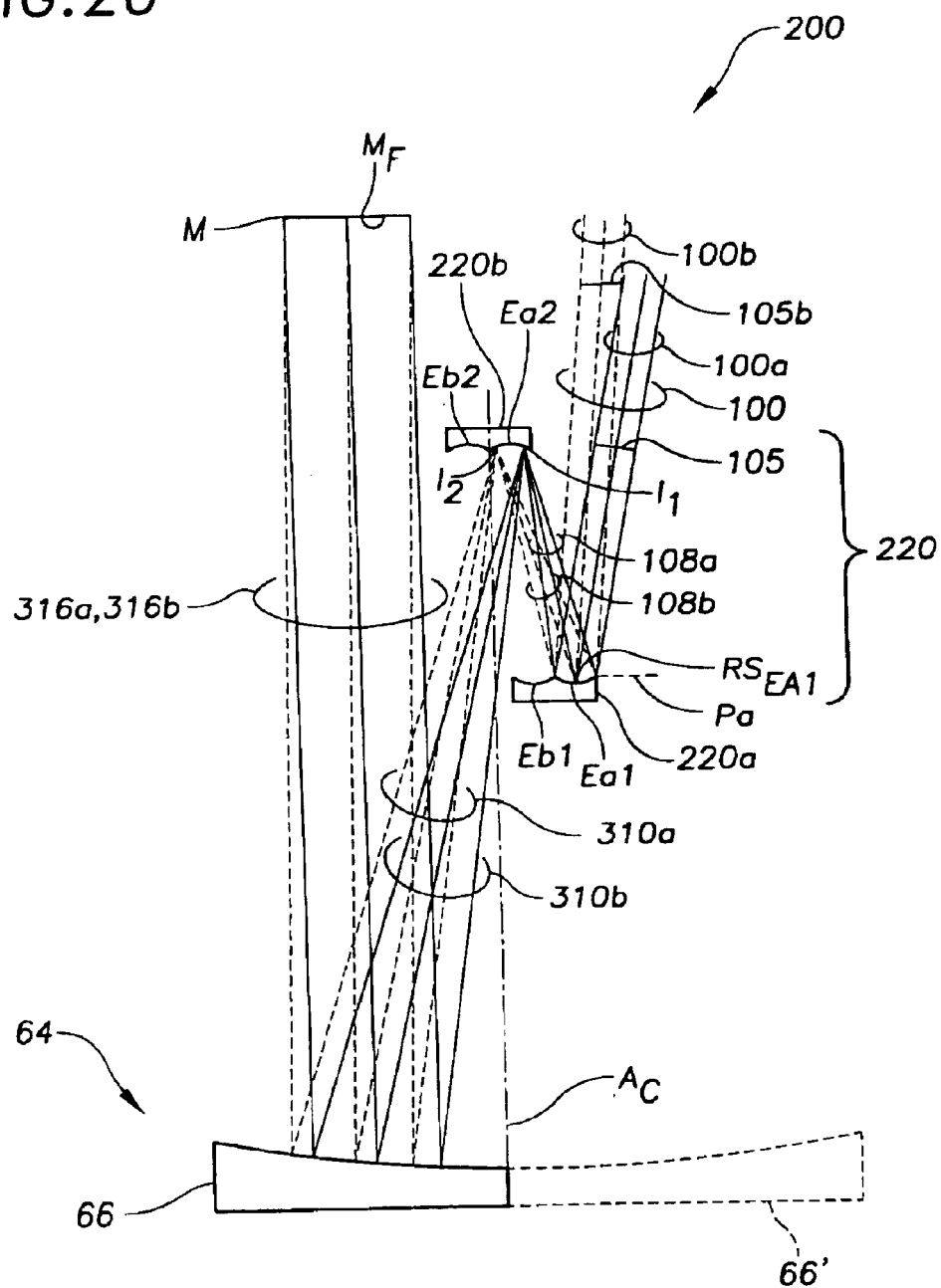
FIG. 20 is a close-up of the exposure apparatus of FIG. 13 showing the reflecting action of the first and second reflecting element groups and the condensing action of the condenser optical system.

With reference now to FIG. 20, the operation of first and second reflecting element groups 220a and 220b are described in more detail. For ease of explanation, FIG. 20 omits plane mirror 68. Further, first reflecting element group 220a comprises only two reflecting elements $E_{a1}$ and $E_{b1}$, and second reflecting element group 220b comprises only two reflecting elements $E_{a2}$ and $E_{b2}$.

Reflecting elements $E_{a1}$ and $E_{b1}$ are arranged along first reference plane $P_a$ at a position substantially optically conjugate to mask M (an object plane of projection optical system 76) or photosensitive substrate W (an imaging plane of projection optical system 76). Reflecting elements $E_{a2}$ and $E_{b2}$ are arranged along a second reference plane $P_b$ at a position substantially optically conjugate to the pupil of projection optical system 76. Light beam 100, which may be, for example, an X-ray beam, comprises light beams 100a and 100b (represented by the solid lines and dotted lines, respectively) each including wavefronts 105a and 105b, respectively, which impinge from respective directions onto reflecting element $E_{a1}$. Light beams 100a and 100b are then split into arcuate light beams 108a and 108b, respectively, corresponding to the profile shape of reflecting surface $RS_{EA1}$ of reflecting element $E_{a1}$. Arcuate light beams 108a and 108b form light source images $I_1$ and $I_2$, respectively, at respective ends of reflecting element $E_{a2}$ in second reflecting element group 220b by the condensing action of reflecting surface $RS_{EA1}$ of reflecting element $E_{a1}$.

If the radiant light in light beam 100 spans the angular range between light beams 100a and 100b and is incident reflecting element $E_{a1}$, a light source image is formed whose size spans light source image $I_1$ and light source image $I_2$ on reflecting element $E_{a2}$ in second reflecting element group 220b. Subsequently, light beams 108a and 108b are condensed by the reflecting and condensing action of reflecting element $E_{a2}$ in second reflecting element group 220b, thereby forming light beams 310a and 310b which are directed toward condenser mirror 66. Light beams 310a and 310b are then further condensed by the reflecting and condensing action of condenser mirror 66, thereby forming light beams 316a (solid lines) and 316b (dotted lines). These beams arcuately illuminate mask M from two directions such that they superimpose at front side $M_F$ of mask M. The optical action due to reflecting element $E_{b1}$ and $E_{b2}$ in reflecting element groups 220a and 220b is the same as described above for reflecting elements $E_{a1}$ and $E_{a2}$.

Thus, the light from plurality of light source images I (i.e., $I_1$, $I_2$, etc.) arcuately illuminate mask M in a superimposed manner, as described above. This allows for efficient and uniform illumination. Moreover, since light beams 108a and 108b are efficiently condensed due to the action of each reflecting element $E_{a2}$, $E_{b2}$, etc., in second reflecting element group 220b (i.e., by the action of these elements as field mirrors), condenser optical system 64 can be made compact.

Since light source images $I_1$, $I_2$, etc., formed on the surface of each reflecting element $E_{a2}$, $E_{b2}$, etc., in second reflecting element group 220b are re-imaged at pupil position P (i.e., the entrance pupil) of projection optical system 76, Köhler illumination is achieved.

As described above in connection with the second mode for carrying out the present invention, light having a certain dispersion angle and a particular wavelength, such as X-rays with a wavelength $\lambda < 100$ nm, is preferably employed. The mask pattern is then exposed onto wafer surface $W_S$ as a photosensitive substrate with an arcuate image field IF', as discussed above. The latter is efficiently formed with uniform illumination intensity while substantially maintaining the conditions of Köhler illumination, even if the illumination apparatus (elements 54–68 of exposure apparatus 200 of FIG. 13) and projection optical system 76 include only catoptric members.

In the second mode for carrying out the present invention, as described above, reflecting elements $E_1$ and $E_2$ and condenser mirror 66 are eccentric spherical surfaces. However, these surfaces can be made aspherical surfaces, in a manner similar to that described above in connection with the first mode for carrying out the present invention.

Figure 21:
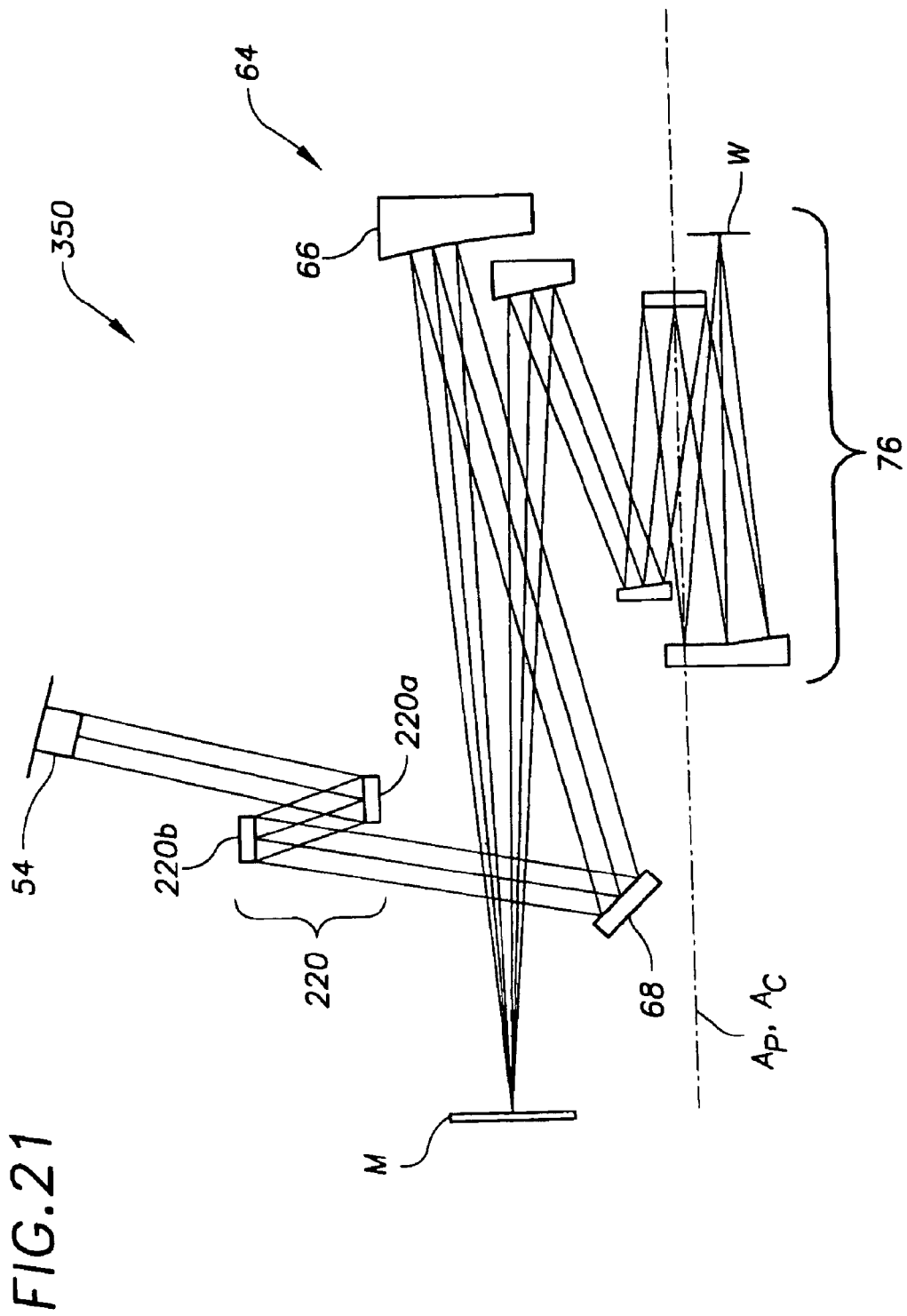
FIG. 21 is an alternate embodiment of the exposure apparatus of FIG. 13, wherein the optical axes of the projection optical system and the condenser optical system are colinear.

In the second mode for carrying out the present invention, as described above, condenser optical system 64 and projection optical system 76 are arranged so that optical axes $A_C$ and $A_P$ are orthogonal. However, with reference to FIG. 21 and exposure apparatus 350, condenser optical system 64, deflecting (plane) mirror 68 and projection optical system 76 may be arranged such that optical axes $A_C$ and $A_P$ are coaxial.

Figure 14:
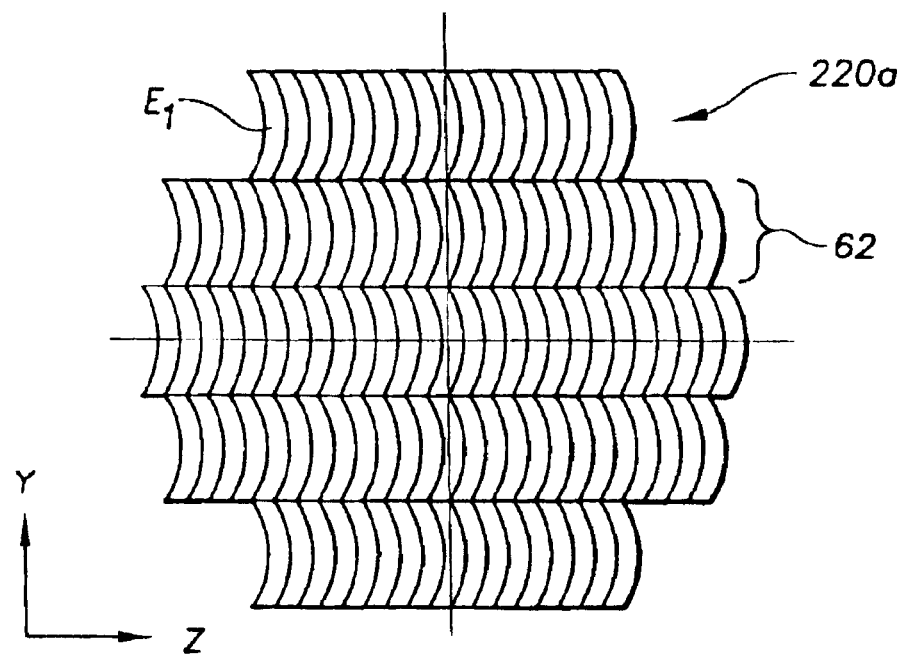
FIG. 14 is a front view of the first reflecting element group of the exposure apparatus of FIG. 13.
Figure 15:
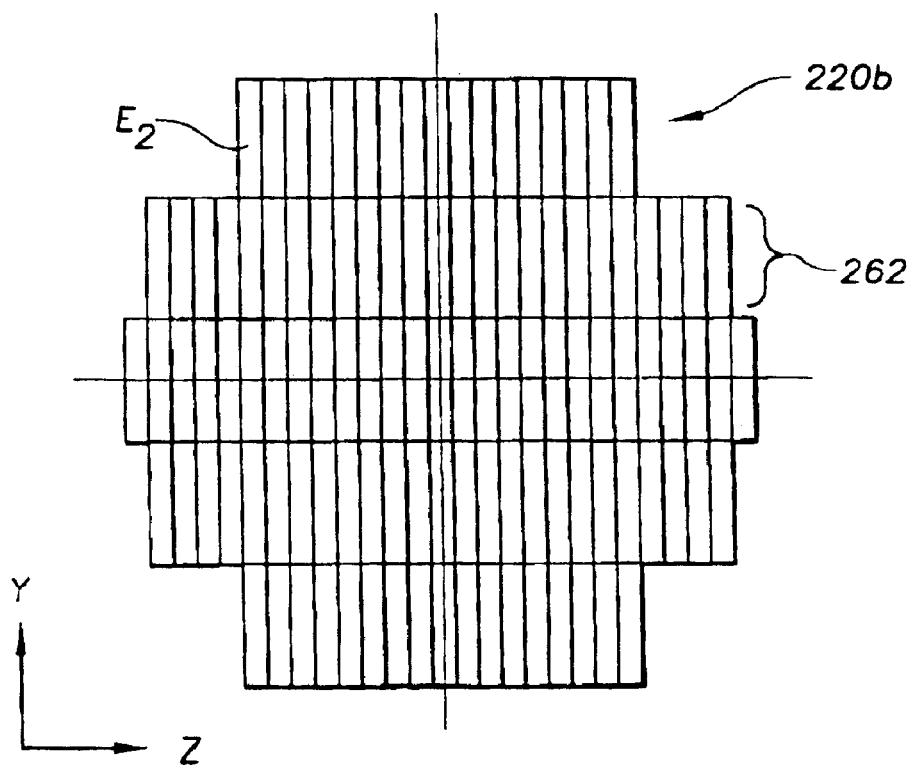
FIG. 15 is a front view of the second reflecting element group of the exposure apparatus of FIG. 13.

Next, a preferred embodiment of the second mode for carrying out the present invention is explained with reference to FIGS. 22 and 23. In the present preferred embodiment, the illumination efficiency of first and second reflecting element groups 360a and 360b, as described below, is even greater than first and second reflecting element groups 220a and 220b (FIGS. 14 and 15).

Figure 22:
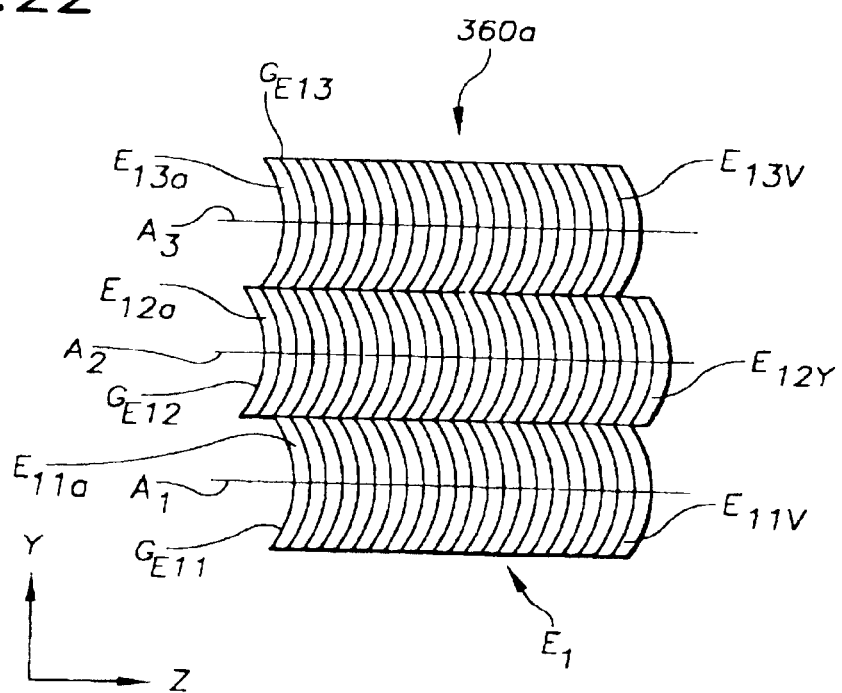
FIG. 22 is a front view of an alternate embodiment of the first reflecting element group of the present invention.

With reference to FIG. 22, first reflecting element group 360a has, along the Y-direction, three columns $G_{E11}$–$GE_{E13}$ of first reflecting elements $E_1$ having a arcuate profile (outline) and arranged in a row (i.e., stacked) along the Z-direction.

Reflecting element columns $G_{E11}$–$G_{E13}$ each comprise a plurality of reflecting elements $E_{11a}$–$E_{11v}$, $E_{12a}$–$E_{12v}$, and $E_{13a}$–$E_{13v}$, respectively. Each reflecting element columns $G_{E11}$–$G_{E13}$ are arranged such that certain reflecting elements therein are each rotated by just a prescribed amount about respective axes $A_1$–$A_3$ oriented parallel to the Z-axis and traversing the center of their respective columns.

Figure 23:
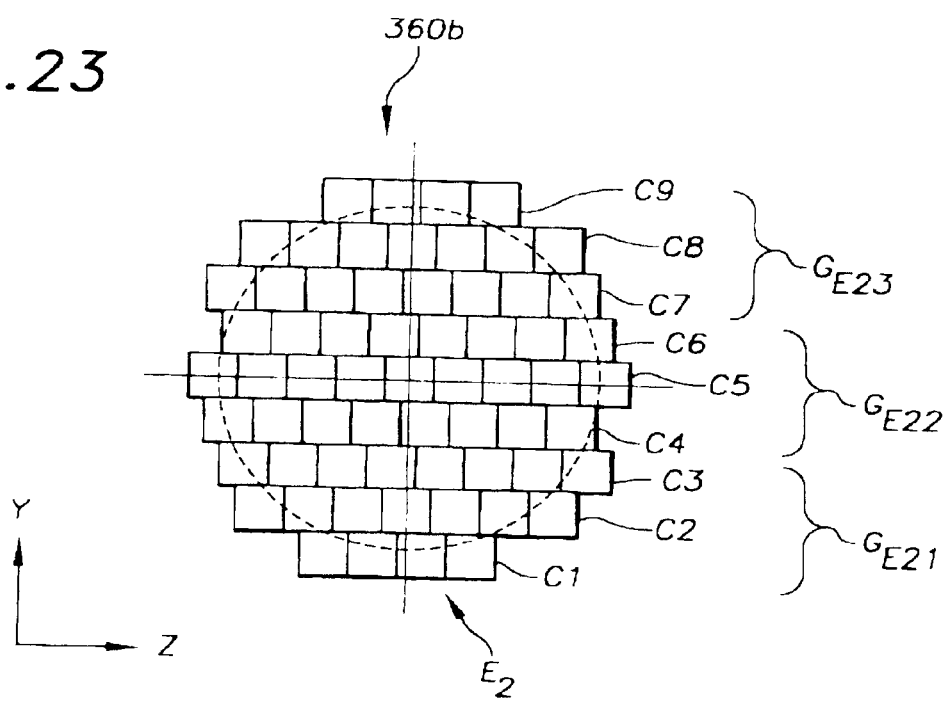
FIG. 23 is a front view of an alternate embodiment of the second reflecting element group of the present invention.

With reference now to FIG. 23, second reflecting element group 360b includes, along the Y-direction, nine columns C1–C9 each comprising a plurality of second reflecting elements $E_2$ having a nearly rectangular profile (outline) and arranged in a row (i.e., stacked) along the Z-direction. Second reflecting element group 360b includes a first subgroup $G_{E21}$ comprising columns C1–C3, a second subgroup $G_{E22}$ comprising columns C4–C6, and a third subgroup $G_{E23}$ comprising columns C7–C9.

First and second reflecting element groups 360a and 360b are opposingly arranged, as described above in connection with apparatus 200 and first and second reflecting element groups 220a and 220b (see, e.g., FIG. 20). Reflecting elements $E_{11a}$–$E_{11v}$ of first reflecting element column $G_{E11}$ in first reflecting element group 360a condense light and form light source images I in the manner described above in connection with first reflecting element group 220a (see FIG. 20). In other words, light source images I formed by reflecting elements $E_{11a}$–$E_{11v}$ are formed on the surfaces of reflecting elements $E_2$ in first subgroup $G_{E21}$. Likewise, additional light source images I are condensed by each reflecting element $E_{12a}$–$E_{12v}$ of second reflecting element column $G_{E12}$ in first reflecting element group 360b on the surfaces of reflecting elements $E_2$ in second subgroup $G_{E22}$. Further, additional light source images I are condensed by each reflecting element $E_{13a}$–$E_{13v}$ of third reflecting element column $G_{E13}$ in first reflecting element group on the surfaces of reflecting elements $E_2$ in third subgroup $G_{E23}$.

Figure 24:
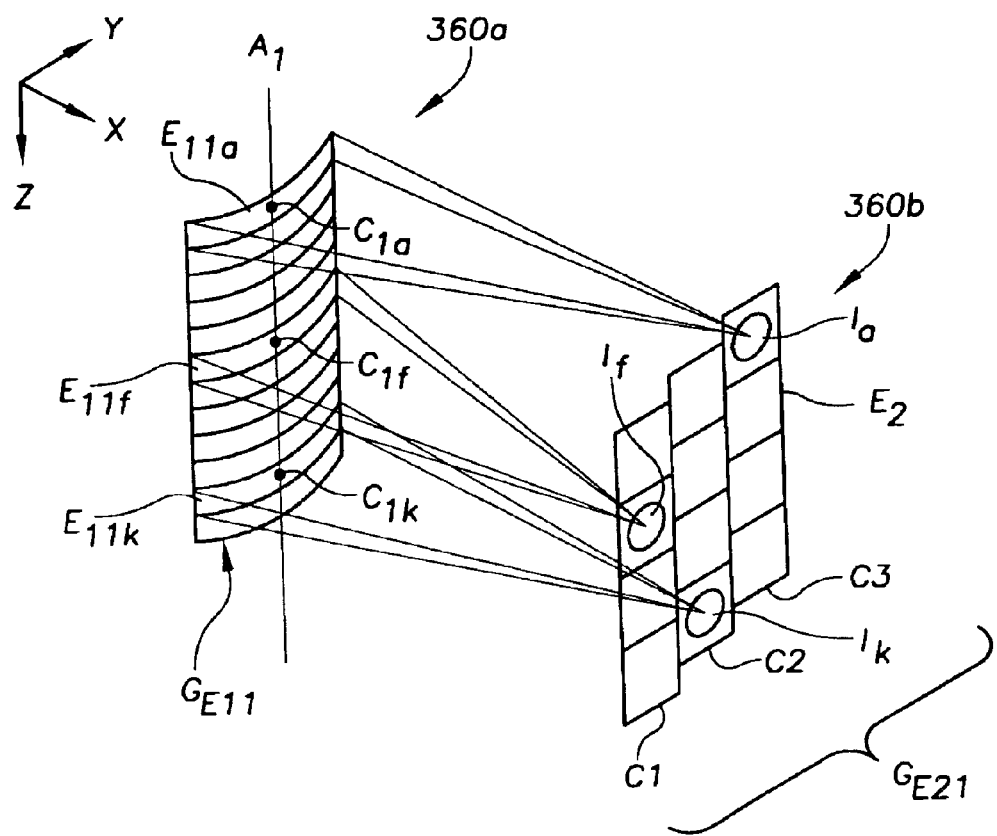
FIG. 24 is a perspective schematic illustration of the reflecting action associated with a single column of the first and second reflecting element groups shown in FIGS. 22 and 23, respectively.

With reference now also to FIG. 24, reflecting elements $E_{11a}$–$E_{11k}$ in first reflecting element column $G_{E11}$ are arranged such that arbitrary reflecting elements therein are rotated by just a prescribed amount about axis $A_1$ oriented parallel to the Z-direction and traversing the center of the first reflecting element column (centers $C1_a$–$C1_k$ of reflecting elements $E_{11a}$–$E_{11k}$).

For example, reflecting element $E_{11a}$ is provided and fixed in a state wherein it is rotated by a prescribed amount counterclockwise about axis $A_1$. This amount of rotation is preferably very small. Reflecting element $E_{11a}$ forms a circular-shaped light source image $I_a$ having a certain size, on the uppermost reflecting element $E_2$ of column C3 of first subgroup $G_{E21}$.

Likewise, reflecting element $E_{11f}$ is provided and fixed in a state wherein it is rotated by just a prescribed amount clockwise about axis $A_1$. Reflecting element $E_{11f}$ forms a circular-shaped light source image $I_f$ having a certain size, on the second reflecting element $E_2$ from the top of first column $C_1$ of first subgroup $G_{E21}$.

In addition, reflecting element $E_{11k}$ is provided and fixed without being rotated about axis $A_1$. Reflecting element $E_{11k}$ forms a circular-shaped light source image $I_k$ having a certain size, on the fourth reflecting element $E_2$ from the top of second column $C_2$ of first subgroup $G_{E21}$. The optical axis (not shown) of reflecting element $E_{11k}$ and the optical axis (not shown) of each reflecting element in first subgroup $G_{E21}$ are parallel to one another.

The arrangement as described above with reference to first reflecting element column $G_{E11}$ and first subgroup $G_{E21}$ applies to that between second reflecting element column $G_{E12}$ and second subgroup $G_{E22}$, and that between third reflecting element column $G_{E13}$ and third subgroup $G_{E23}$, in first reflecting element group 360a.

As described above, illumination efficiency can be improved if the configuration of the first and second reflecting element groups 360a and 360b (FIGS. 23 and 24) is adopted. This configuration has the advantage that light source images $I_a$, $I_f$, $I_k$, etc., are not easily obscured by the profile (outline) of the second reflecting elements, as compared to the configuration of the first and second reflecting elements in reflecting element groups 220a and 220b.

In the above first and second modes for carrying out the present invention, reflecting elements E of reflecting element group 60, and reflecting elements $E_1$ of reflecting element group 220a have an arcuate profile (outline) and having reflective surfaces $RS_E$ and $RS_{E1}$ respectively, eccentric with respect to the optical axes $A_E$, and $A_{E1}$, respectively. Consequently, constraints from the standpoint of optical design are significantly relaxed as compared to non-eccentric reflecting elements. This is because aberrations need only be corrected in the arcuate region at a certain image height (i.e., a certain distance from the optical axis). Accordingly, aberrations generated by the reflecting elements in the first reflecting element group can be sufficiently controlled, resulting in very uniform arcuate illumination.

Aberrations generated by condenser optical system 64 (FIGS. 4 and 13) can also be sufficiently controlled by configuring the condenser optical system as an eccentric mirror system. This allows the above advantages to be obtained synergistically. Furthermore, condenser optical system 64 can comprise one eccentric mirror (e.g., condenser mirror 66), or a plurality of such mirrors.

First and second reflecting element groups in the present invention may be moved by a small amount independently or as a unit in a prescribed direction (e.g., axially or orthogonal thereto). Alternatively, first and second reflecting groups may be constituted such that at least one of the first reflecting element group and second reflecting element group is capable of being inclined by a small amount. This allows for the illumination intensity distribution in the arcuate illumination field IF formed on front side $M_F$ or wafer W (photosensitive substrate) to be adjusted. In addition, it is preferable that at least one eccentric mirror in condenser optical system 64 be capable of being moved or inclined by a minute amount in a prescribed direction (i.e., along optical axis $A_C$ or orthogonal thereto).

In the present invention, it is advantageous to compactly configure the exposure apparatus while simultaneously maintaining a satisfactory arcuate illumination field IF. To this end, it is preferable in the present invention that the first reflecting element group (220a of FIG. 14 or 360a of FIG. 22) and condenser optical system 64 satisfy condition (2), discussed above.

In addition, the above modes for carrying out the present invention included optical integrators 56, 220, and 360 comprising optical elements having reflective surfaces. However, the optical integrators of the present invention may also comprise refractive lens elements. In this case, the cross-sectional shape of such refractive lens elements constituting a first "refractive" element group are preferably arcuate.

Furthermore, in the present invention, first and second reflecting element groups 220a and 220b and first and second reflective element groups 360a and 360b are depicted as having plurality of reflecting elements $E_1$ and $E_2$ which are densely in an array arranged with essentially no gaps between the individual elements. However, in the second reflective element groups 220b and 360b (FIG. 15 and FIG. 23), plurality of reflecting elements $E_2$ need not be so densely arranged. This is because numerous light source images corresponding respectively to the reflecting elements $E_2$ are formed on second reflective element group 220b and 360b, or in the vicinity thereof. Light loss does not occur to the extent that the light source images fit within the effective reflecting region of each reflecting element $E_2$. Accordingly, if the numerous light source images are formed discretely, the numerous reflecting elements $E_2$ in the second reflective element group can be arranged discretely with gaps. The same holds true for second reflective element group 360b.

Figure 25:
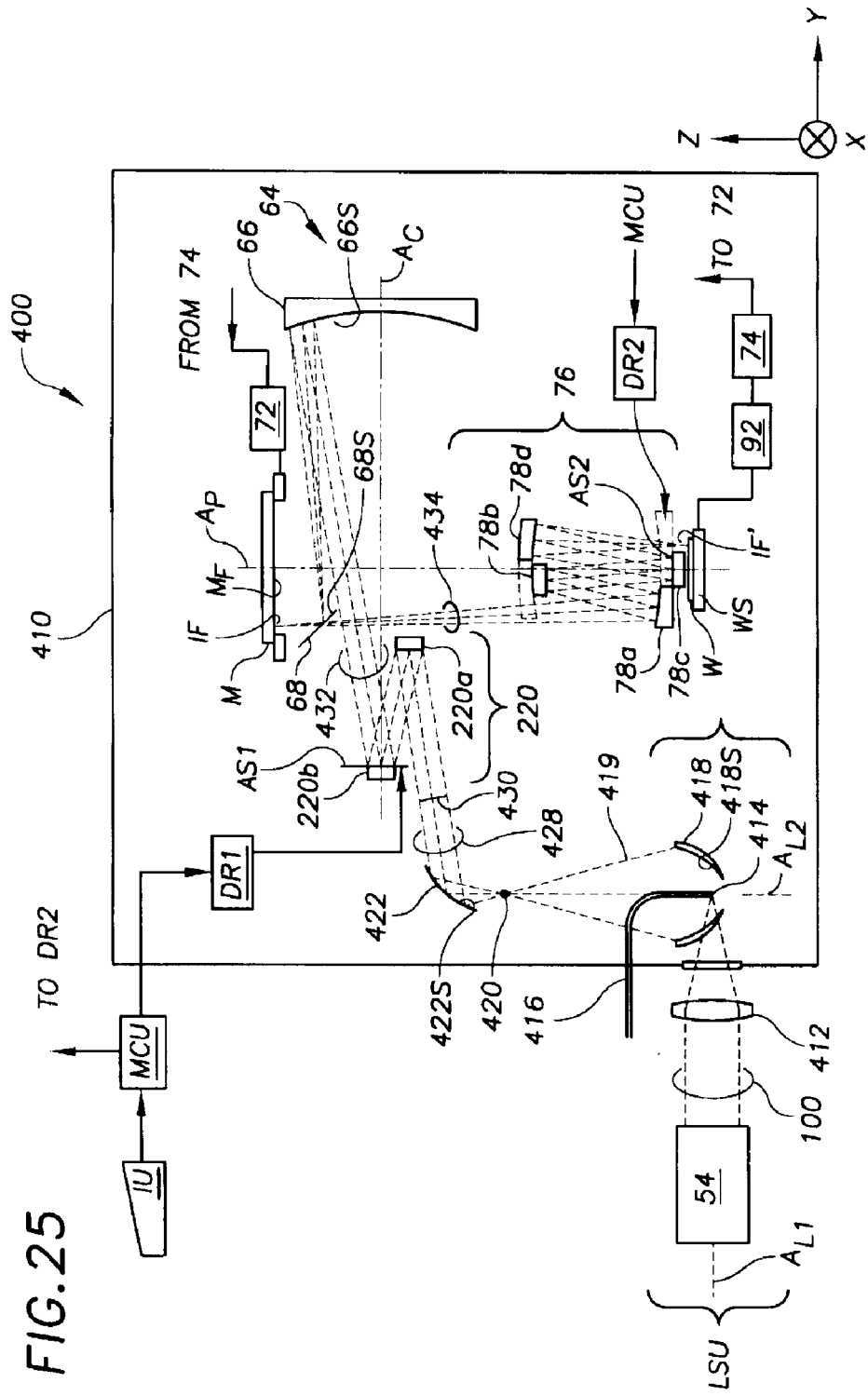
FIG. 25 is a first alternate embodiment of the exposure apparatus of FIG. 4, further including a vacuum chamber, a light source unit and variable aperture stop.

With reference now to FIG. 25, exposure apparatus 400 performs the exposure operation by a step-and-scan method according to the first mode for carrying out the present invention in a manner similar to that described in connection with exposure apparatus 50 of FIG. 4. The elements in exposure apparatus 400 having the same function as those in exposure apparatus 50 of FIG. 4 are assigned the same reference symbol. Exposure apparatus 400 uses, in a preferred embodiment, light in the soft X-ray region on the order of λ=5–20 nm EUV (Extreme Ultra Violet) light. In FIG. 25, the Z-direction is the direction of optical axis $A_P$ of projection optical system 76 that forms a reduced image of reflective mask M onto wafer W. The Y-direction is the direction within the paper surface and orthogonal to the Z-direction. The X-direction is the direction perpendicular to the paper surface and orthogonal to the Y-Z plane.

Exposure apparatus 400 projects onto wafer W the image of one part of the circuit pattern (not shown) drawn on front side $M_F$ of mask M through projection optical system 76. The entire circuit pattern of mask M is transferred onto each of a plurality of exposure regions on wafer W by scanning mask M and wafer W in a one-dimensional direction (Y direction) relative to projection optical system 76.

Since soft X-rays (EUV light) have a low transmittance through the atmosphere, the optical path through which this light passes is enclosed in vacuum chamber 410 and isolated from the outside air.

With continuing reference to FIG. 25, light source 54 supplies light beam 100 having a high illumination intensity and a wavelength from the infrared region to the visible region. Light source 54 may be, for example, a YAG laser, an excimer laser or a semiconductor laser. Light beam 100 from light source 54 is condensed by condenser optical member 412 to a position 414. Nozzle 416 provides a jet of gaseous matter toward position 414, where it receives laser light beam 100 of a high illumination intensity. At this time, the jetted matter reaches a high temperature due to the energy of laser light beam 100, is excited into a plasma state, and discharges EUV light 419 when the gaseous matter transitions to a low-energy state.

An elliptical mirror 418 is arranged at the periphery of position 414 such that its first focal point (not shown) nearly coincides with convergent position 414. A multilayer film is provided on the inner surface 418S of elliptical mirror 418 to reflect EUV light 419. The reflected EUV light 419 is condensed at a second focal point 420 of elliptical mirror 418 and then proceeds to a collimating mirror 422, which is preferably concave and may be paraboloidal. Collimating mirror 422 is positioned such that the focal point (not shown) thereof nearly coincides with second focal point 420 of elliptical mirror 418. A multilayer film is provided on the inner surface 422S of collimating mirror 422 to reflect EUV light 419. Condenser optical member 412, elliptical mirror 418 and collimating mirror 422 constitute a condenser optical system. Light source 54, and the condenser optical system constitute a light source unit LSU with optical axes $A_{L1}$ and $A_{L2}$. EUV light 419 reflected by collimating mirror 422 proceeds to optical integrator (e.g. reflecting type fly's eye system) 220 in a nearly collimated state. A multilayer film is provided onto the plurality of reflecting surfaces constituting first and second reflecting element groups 220a and 220b to enhance reflection of EUV light 419.

Exposure apparatus 400 further includes a first variable aperture stop AS1 provided at the position of the reflecting surface of second reflecting element group 220b or in the vicinity thereof. Variable aperture stop AS1 is capable of varying the numerical aperture NA of the light illuminating mask M (i.e., the illumination numerical aperture). First variable aperture stop AS1 has a nearly circular variable aperture, the size of which is varied by a first drive system DR1 operatively connected thereto.

A collimated EUV light beam 428 from collimating mirror 422 includes a wavefront 430 that is split by first reflecting element group 220a and is condensed to form a plurality of light source images (not shown), as discussed above. The plurality of reflecting elements $E_2$ of second reflecting element group 220b are positioned in the vicinity of the location of the plurality of light source images. The plurality of reflecting elements $E_2$ of second reflecting element group 220b substantially acts as field mirrors. In this manner, optical integrator 220 forms a plurality of light source images as secondary light sources from approximately parallel light beam 428. The EUV lightbeam 432 (comprising a plurality of light beams) from the secondary light sources formed by optical integrator 220 proceeds to condenser mirror 66 positioned such that the secondary light source images are formed at or near the focal point of the condenser mirror. Light beam 432 is reflected and condensed by condenser mirror 66, and is deflected to mask M by fold mirror 68. A multilayer film that reflects EUV light is provided on surface 66S of condenser mirror 66 and surface 68S of fold mirror 68. Condenser mirror 66 condenses EUV light in light beam 432 in a superimposed manner, forming an arcuate illumination field on front side $M_F$ of mask M.

A multilayer film that reflects EUV light is provided on front side $M_F$ of mask M. Thus, EUV light incident thereon is reflected from mask M as light beam 434. The latter passes to projection system 76, which images mask M onto wafer W as the photosensitive substrate.

In the present mode for carrying out the present invention, it is preferable to spatially separate the optical paths of light beam 432 that proceeds to mask M and light beam 434 reflected by the mask that proceeds to projection optical system 76. In this case, the illumination system is nontelecentric, and projection optical system 76 is also nontelecentric on the mask M side. Projection optical system 76 also includes multilayer films that reflects EUV light provided on the reflecting surfaces of the four mirrors 78a–78d for enhancing EUV light reflectivity.

Mirror 78c in projection optical system 76 is arranged at the pupil position or in the vicinity thereof. A second variable aperture stop AS2 capable of varying the numerical aperture of projection optical system 76 is provided at the reflecting surface of mirror 78C or in the vicinity thereof. Second variable aperture stop AS2 has a nearly circular variable aperture, the diameter of which is capable of being varied by second drive system DR2 operatively connected thereto.

The ratio of the numerical aperture of the illumination system $NA_1$ to the numerical aperture $NA_P$ of projection optical system 76 is called the coherence factor, or σ value (i.e., $\sigma = NA_I / NA_P$).

Due to the degree of fineness of the pattern on mask M to be transferred to wafer W and the process of transferring this pattern to wafer W, it is often necessary to adjust the resolving power and depth of focus and the like of projection optical system 76 by varying the σ value. Consequently, exposure information related to the exposure conditions of each wafer W sequentially mounted on wafer stage WS by a transport apparatus (not shown) (wafer transport map and the like that includes exposure information), and the mounting information of each type of mask M sequentially mounted on mask stage MS is input to a control apparatus MCU through input apparatus IU, such as a console electrically connected thereto. Control apparatus MCU is electrically connected to first and second drive systems DR1 and DR2. Based on the input information from input apparatus IU, each time a wafer W is mounted on substrate stage WS, control apparatus MCU determines whether to change the σ value. If control apparatus MCU determines that it is necessary to change the σ value, a signal is sent therefrom to at least one of two drive systems DR1 and DR2, to vary at least one aperture diameter among first variable aperture stop AS1 and second variable aperture stop AS2. Consequently, the appropriate exposure can be achieved under various exposure conditions. The light intensity distribution at a pupil position of projection optical system 76 is changed by using the illumination condition changing system including first variable aperture stop AS1, second variable aperture stop AS2 and drive systems DR1 and DR2.

With continuing reference to FIG. 25, it is preferable in the present embodiment to replace collimating mirror 422 with a collimating mirror having a different focal length, in response to varying the aperture diameter of first variable aperture stop AS1. As a result, the diameter of EUV light beam 428 incident optical integrator 220 can be changed in accordance with the size of the opening of first variable aperture stop AS1. In this manner, illumination at an appropriate σ value is enabled while maintaining a high illumination efficiency.

The light illumination intensity distribution on mask M or wafer W of exposure apparatus 400 may be nonuniform, in the sense that it is biased. In this case, this bias can be corrected by making light beam 428 eccentric prior to traversing reflecting element group 220a. For example, by making collimating mirror 422 slightly eccentric, the bias of the light illumination intensity distribution can be corrected. In other words, if the bias of the intensity distribution occurs in the lateral X-direction of the arcuate illumination field IF (or in arcuate image field IF' on surface $W_S$ of wafer W), the bias can be corrected by moving collimating mirror 422 in the X-direction. If the illumination intensity in arcuate illumination field IF at the center part and peripheral part differs in the width direction, respectively, the bias of the light illumination intensity distribution can be corrected by moving collimating mirror 422 in the same direction.

When varying at least one aperture diameter among first variable aperture stop AS1 and second variable aperture stop AS2, there are cases wherein the illumination deteriorates. For example, illumination non-uniformity occurs over the arcuate illumination field IF. In this case, it is preferable to correct illumination non-uniformity and the like over the arcuate illumination field IF by slightly moving at least one of collimating mirror 422, optical integrator 220 and condenser mirror 66.

Figure 26:
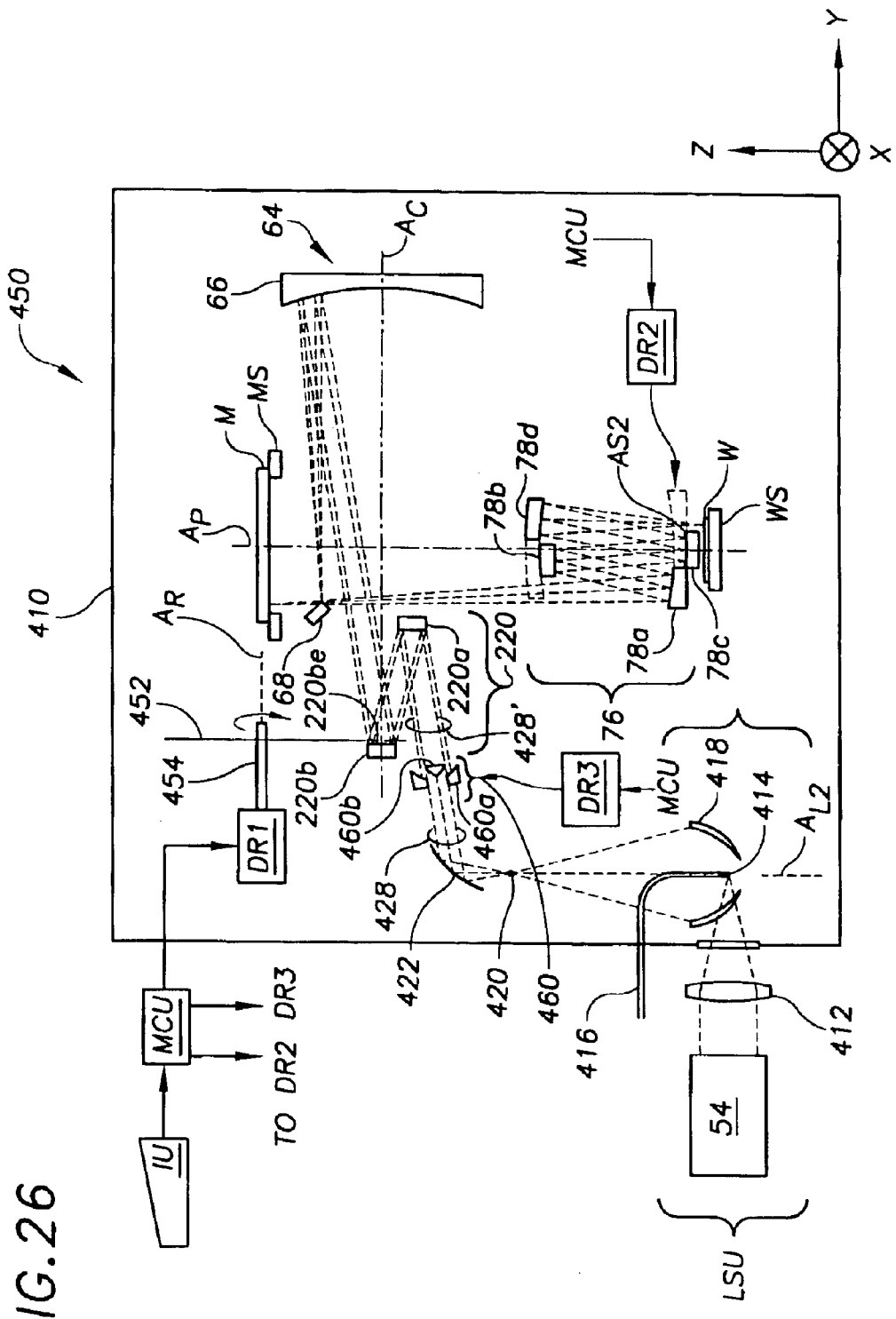
FIG. 26 is a second alternate embodiment of the exposure apparatus of FIG. 4, further including a turret plate in place of the first variable aperture stop, and an adjustable light beam converting unit.

With reference now to FIG. 26, exposure apparatus 450, which is an alternate embodiment of exposure apparatus 400, is now described by highlighting the difference between these two apparatus.

Figure 27:
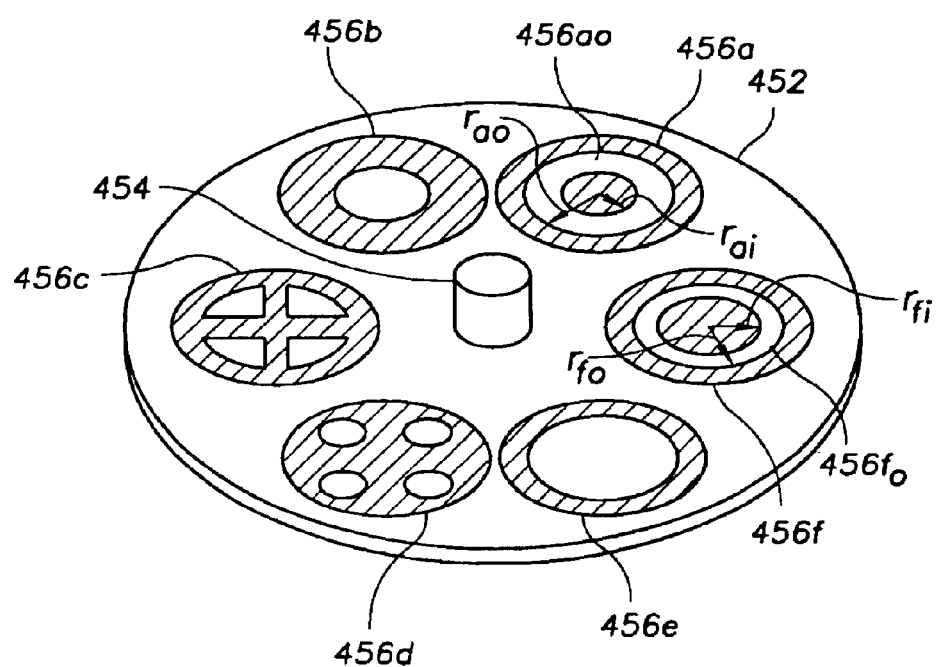
FIG. 27 is a perspective view of the aperture turret plate of the exposure apparatus of FIG. 26.

The first difference between exposure apparatus 400 and exposure apparatus 450 is that exposure apparatus includes a turret plate 452 instead of first variable aperture stop AS1. Turret plate 452 is connected to a drive shaft 454, connected to first drive system DR1. Turret plate 452 is thus rotatable about a rotational axis $A_R$ by first drive system DR1. With reference to FIG. 27, turret plate 452 comprises a plurality of aperture stops 456a–456f having different shapes and sizes. Turret plate 452 is discussed in more detail, below.

With reference again to FIG. 26, exposure apparatus 450 further includes an adjustable annular light beam converting unit 460. The latter converts EUV light beam 428 having a circular cross-section to a light beam 428' having an annular (ring-shaped) light beam cross section. Unit 460 is movably provided in the optical path (e.g., light beam 428) between collimating mirror 422 and first reflecting element group 220a of optical integrator 220.

Annular light beam converting unit 460 has a first reflecting member 460a with a ring-shaped reflecting surface and second reflecting member 460b having a conical reflecting surface. To vary the ratio of the inner diameter of the ring to the outer diameter of (the so-called "annular ratio") of light beam 428', first reflecting member 460a and second reflecting member 460b are moved relative to one another.

The insertion and removal of annular light beam converting unit 460 in and out of light beam 428 and the relative movement of first reflecting member 460a and second reflecting member 460b is performed by a third drive system DR3 in operable communication with annular light beam converting unit 460 and electrically connected to control apparatus MCU.

With reference now again to FIG. 27, further details concerning turret plate 452 and annular light beam converting unit 460 are explained. Turret plate 452, as discussed briefly above, includes a plurality of different aperture stops 456a–456f and is rotatable about axis $A_R$. Aperture stop 456a has an annular (donut-shaped) aperture, and aperture stops 456b and 456e have circular openings with different aperture diameters. Aperture stop 456c has four fan-shaped openings, and aperture stop 456d has four circular openings. Aperture stop 456f has an annular ratio (ratio of outer diameter $r_{fo}$ to inner diameter $r_{fi}$ of opening $456_{fo}$ of the annular shape) different from that of aperture stop 456a (with outer diameter $r_{ao}$ and inner diameter $r_{ai}$).

In exposure apparatus 450, input apparatus IU is for inputting information necessary for selecting the method of illuminating mask M and exposing wafer W. For example, input apparatus IU inputs exposure information related to the exposure conditions of each wafer W sequentially mounted by an unillustrated transport apparatus (wafer transfer map and the like that includes the exposure information), and mounting information of each type of mask M sequentially mounted on mask stage MS. This information is based on the degree of fineness of the mask pattern to be transferred to wafer W and the process associated with transferring the pattern to wafer W.

For example, control apparatus MCU can select illumination states such as "first annular illumination," "second annular illumination," "first normal illumination," "second normal illumination," "first special oblique illumination," and "second special oblique illumination," based on the information input into input apparatus IU.

"Annular illumination" aims to improve the resolving power and depth of focus of projection optical system 76. It does so by illuminating EUV light onto mask M and wafer W from an oblique direction by setting the shape of the secondary light sources formed by optical integrator 220 to an annular shape. "Special oblique illumination" aims to further improve the resolving power and depth of focus of projection optical system 76. It does so by illuminating EUV light onto catoptric mask M and wafer W by making the secondary light sources formed by optical integrator 220 a discrete plurality of eccentric light sources. These light sources are made eccentric by just a predetermined distance from the center thereof. "Normal illumination" is one that aims to illuminate mask M and wafer W based on an optimal σ value by making the shape of the secondary light sources formed by optical integrator 220 nearly circular.

Based on the input information from input apparatus IU, control apparatus MCU controls first drive system DR1 to rotate turret plate 452, second drive system DR2 to change the aperture diameter of aperture stop AS2 of projection optical system 76, and third drive system DR3 to insert and remove annular light beam converting unit 460 in and out light beam 428. Control apparatus MCU changes the relative spacing between the two reflecting members 460a and 460b in annular light beam converting unit 460.

If the illumination state on mask M is set to normal illumination, control apparatus MCU selects "first normal illumination" or "second normal illumination," based on the input information from input apparatus IU. "First normal illumination" and "second normal illumination" have different σ values.

For example, if control apparatus MCU selects "first normal illumination," control apparatus MCU rotates turret plate 452 by driving first drive system DR1 so that aperture stop 456e is positioned at the secondary light sources formed on exit side 220be of second reflective element group 220b. Simultaneously, control apparatus MCU changes, as needed, the aperture diameter of second aperture stop AS2 via second drive system DR2. At this point, if annular light beam converting unit 460 is set in light beam 428, control apparatus MCU withdraws this unit from the illumination optical path via third drive system DR3.

If EUV light illuminates the mask pattern of mask M based on the set condition of the illumination system mentioned above, the pattern can be exposed onto wafer W through projection optical system 76 based on the appropriate "first normal illumination" condition (i.e., an appropriate σ value).

If control apparatus MCU selects "second normal illumination," control apparatus MCU rotates turret plate 452 by driving first drive system DR1 so that aperture stop 456b is positioned at the secondary light sources formed on exit side 220be of second reflective element group 220b. Simultaneously, control apparatus MCU changes, as needed, the aperture diameter of the second aperture stop AS2 via second drive system DR2. At this point, if annular light beam converting unit 460 is set in light beam 428, control apparatus MCU withdraws this unit from the illumination optical path via third drive system DR3.

If EUV light illuminates the mask pattern of mask M based on the set condition of the illumination system mentioned above, the pattern can be exposed onto wafer W through projection optical system 76 based on the appropriate "second normal illumination" condition (i.e., σ value larger than that of first normal illumination).

As mentioned in connection with exposure apparatus 400 (FIG. 25), it is preferable in exposure apparatus 450 (FIG. 26) to replace reflecting mirror 422 with a reflecting mirror having a focal length different therefrom in response to the varying of the aperture diameter of first variable aperture stop AS1. As a result, the beam diameter of light beam 428 can be changed in response to the size of the opening of first variable aperture stop AS1. Thus, illumination is enabled with an appropriate σ value while maintaining a high illumination efficiency.

If the illumination with respect to mask M is set to oblique illumination, control apparatus MCU selects, based on the input information from input apparatus IU, one among "first annular illumination," "second annular illumination," "first special oblique illumination" and "second special oblique illumination." "First annular illumination" and "second annular illumination" differ in that the annular ratios of the secondary light sources formed annularly are different. "First special oblique illumination" and "second special oblique illumination" differ in their secondary light source distributions. In other words, the secondary light source in "first special oblique illumination" is distributed in four fan-shaped regions (aperture stop 456c), and the secondary light sources in "second special oblique illumination" are distributed in four circular regions (aperture stop 456d).

If "first annular illumination" is selected, control apparatus MCU rotates turret plate 452 by driving drive system DR1 so that aperture stop 456a is positioned at the position of the secondary light sources formed on exit side 220be of second reflective element group 220b. If "second annular illumination" is selected, control apparatus MCU rotates turret plate 452 by driving drive system DR1 so that aperture stop 456f is positioned at the position of the secondary light sources formed on exit side 220be of second reflective element group 220b. If "first special oblique illumination" is selected, control apparatus MCU rotates turret plate 452 by driving drive system DR1 so that aperture stop 456c is positioned at the position of the secondary light sources formed on exit side 220be of second reflective element group 220b. If "second special oblique illumination" is selected, control apparatus MCU rotates turret plate 452 by driving drive system DR1 so that aperture stop 456d is positioned at the position of the secondary light sources formed on exit side 220be of second reflective element group 220b.

If one among the above four aperture stops 456a, 456c, 456d, and 456f is set in light beam 428, control apparatus MCU simultaneously changes, as needed, the aperture diameter of second aperture stop AS2 in projection optical system 76 via second drive system DR2.

Next, control apparatus MCU sets annular light beam converting unit 460 in light beam 428 via third drive system DR3 and adjusts the unit. The operation of setting and adjusting annular light beam converting unit 460 is performed as described below.

First, if annular light beam converting unit 460 is not set in light beam 428, control apparatus MCU sets the unit in the light beam via third drive system DR3.

Next, control apparatus MCU changes the relative spacing of the two reflecting members 460a and 460b in annular light beam converting unit 460 via third drive system DR3 so that the annular light beam (now light beam 428') is efficiently guided to the opening of one aperture stop among the four aperture stops 456a, 456c, 456d, and 456f set on exit side 220be of second reflective element group 220b. As a result, annular light beam converting unit 460 can convert light beam 428 incident thereon to annular light beam 428' having an appropriate annular ratio.

Secondary light sources (not shown) formed by optical integrator 220 can, by the setting and adjustment of the above annular light beam converting unit 460, be rendered annular secondary light sources having an appropriate annular ratio corresponding to the opening of each of the four aperture stops 456a, 456c, 456d, and 456f. Thus, oblique illumination of mask M and wafer W can be performed with a high illumination efficiency. The light intensity distribution at a pupil position of projection system 76 is changed by using the illumination condition changing system including turret plate 452 having plurality of aperture stops 456a–456f, second variable aperture stop AS2, annular light beam converting unit 460 and three drive systems DR1, DR2 and DR3.

Thus, one of a plurality of aperture stops 456a–456f having mutually differing shapes and sizes can be set in the illumination optical path by rotating turret plate 452. Thus, the illumination state, such as illumination unevenness, of the arcuate illumination field IF or the arcuate image field IF' may change. It is preferable to correct this illumination unevenness by slightly moving at least one of collimating mirror 422, optical integrator 220 and condenser mirror 66.

With continuing reference to FIG. 26 and exposure apparatus 450, information like the illumination condition is input to control apparatus MCU via input apparatus IU. However, a detector (not shown) that reads the information on mask M may also be provided. Information related to the illumination method is recorded by, for example, a barcode and the like at a position outside the region of the mask pattern of mask M. The detector reads the information related to this illumination condition and transmits it to control apparatus MCU. The latter, based on the information related to the illumination condition, controls the three drive apparatus DR1–DR3, as described above, to set the illumination.

In exposure apparatus 450, one of aperture stops 456*a*–456*f* is provided at exit side 220*be* of optical element group 220*b* (i.e., the position of the secondary light sources). However, illumination by aperture stops 456*c* and 456*d* having four eccentric openings need not be provided. Also, aperture stops 456*a*–456*f* formed on turret plate 452 are not essential to the present invention in the case of performing "annular illumination" or "normal illumination," as will be understood by one skilled in the art from the theory of the present invention.

Four eccentric light beams can be formed by constituting first reflecting member 460*a*, in annular light beam converting unit 460, by two pairs of plane mirror elements (not shown) arranged opposite one another and mutually inclined, and by constituting the reflecting surface of reflecting member 460*a* in a square column shape. As a result, the secondary light sources formed by optical integrator 220 can be rendered quadrupole secondary light sources eccentric to the center thereof. Accordingly, EUV light corresponding to the openings of aperture stops 456*c* and 456*d* having four eccentric openings can be formed.

Figure 28:
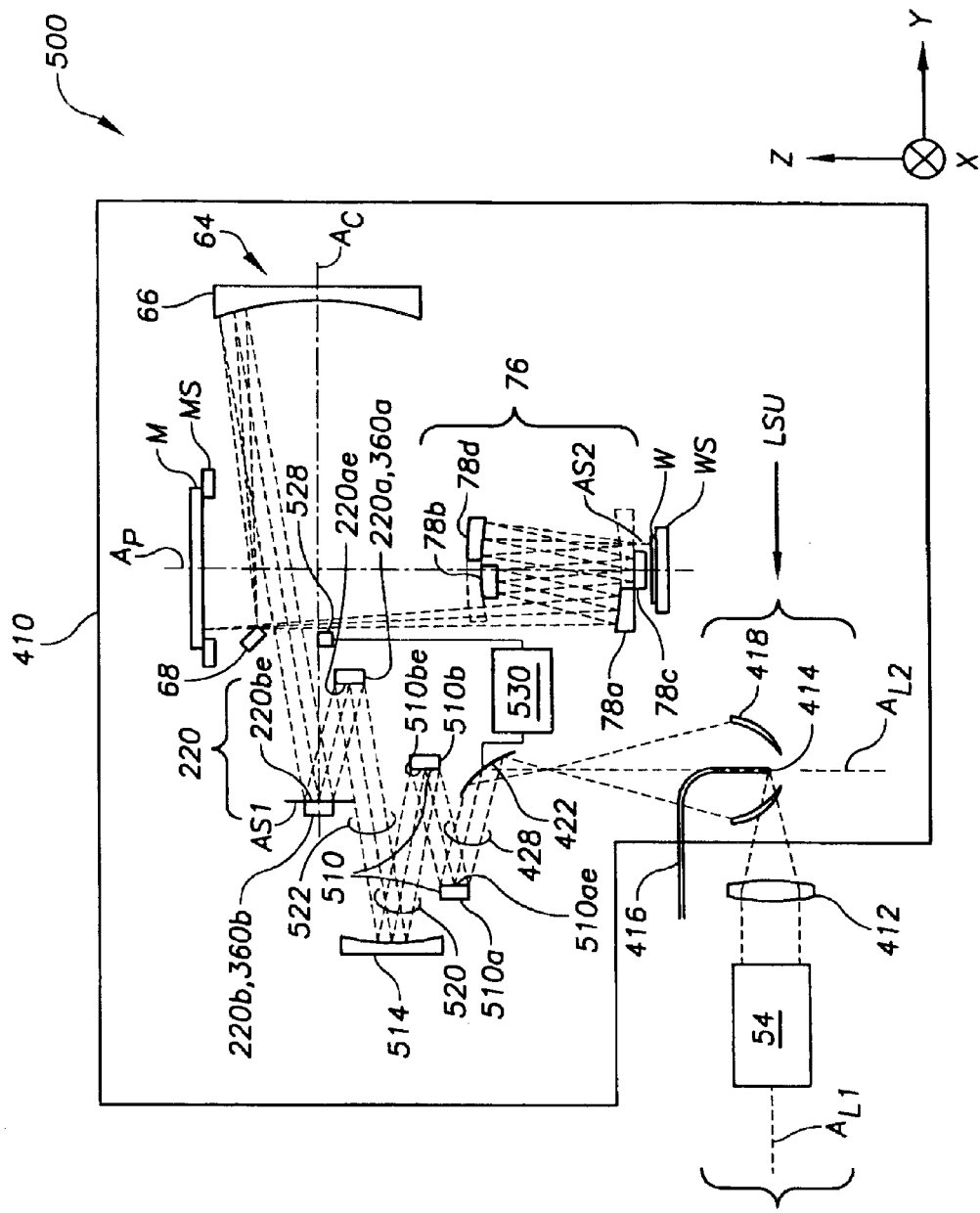
FIG. 28 is a third alternate embodiment of the exposure apparatus of FIG. 4, further including an auxiliary optical integrator.

With reference now to FIG. 28, exposure apparatus 500, which is another modified version of exposure apparatus 400, is now described. In exposure apparatus 500, as well as in exposure apparatus 550 and 600 discussed below (FIGS. 29 and 30), elements AS1, 452, AS2, DR1, DR2, IU and MCU are included, as discussed above. However, these elements are not shown in FIGS. 28–36 for the sake of illustration.

Figure 29:
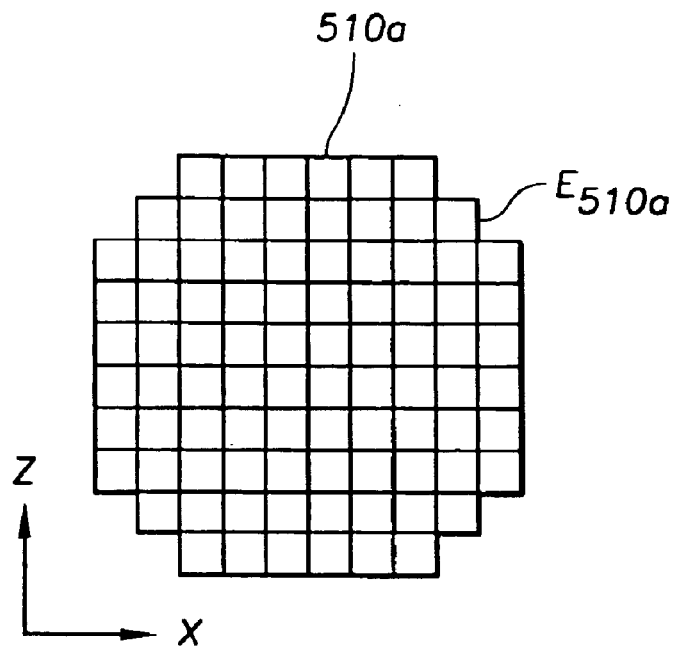
FIG. 29 is a front view of the first auxiliary reflecting element group in the auxiliary optical integrator of the exposure apparatus of FIG. 28.
Figure 30:
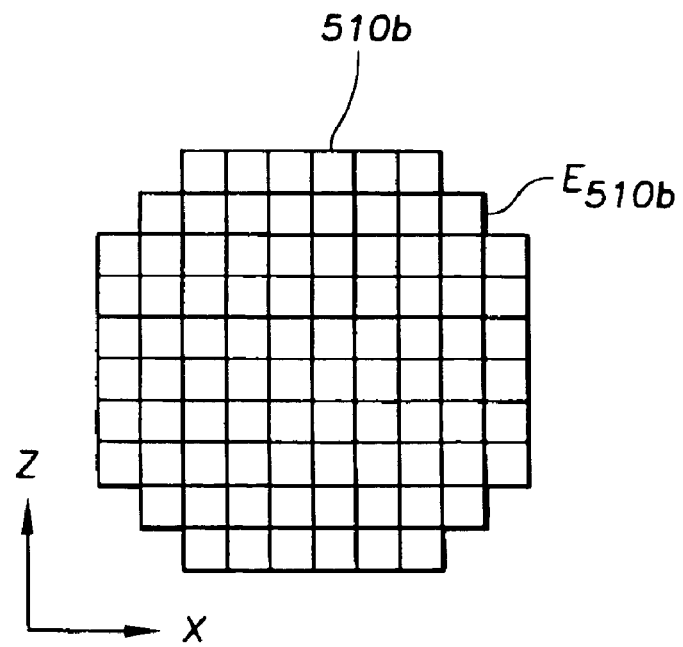
FIG. 30 is a front view of the second auxiliary reflecting element group in the auxiliary optical integrator of the exposure apparatus of FIG. 28.
Figure 31:
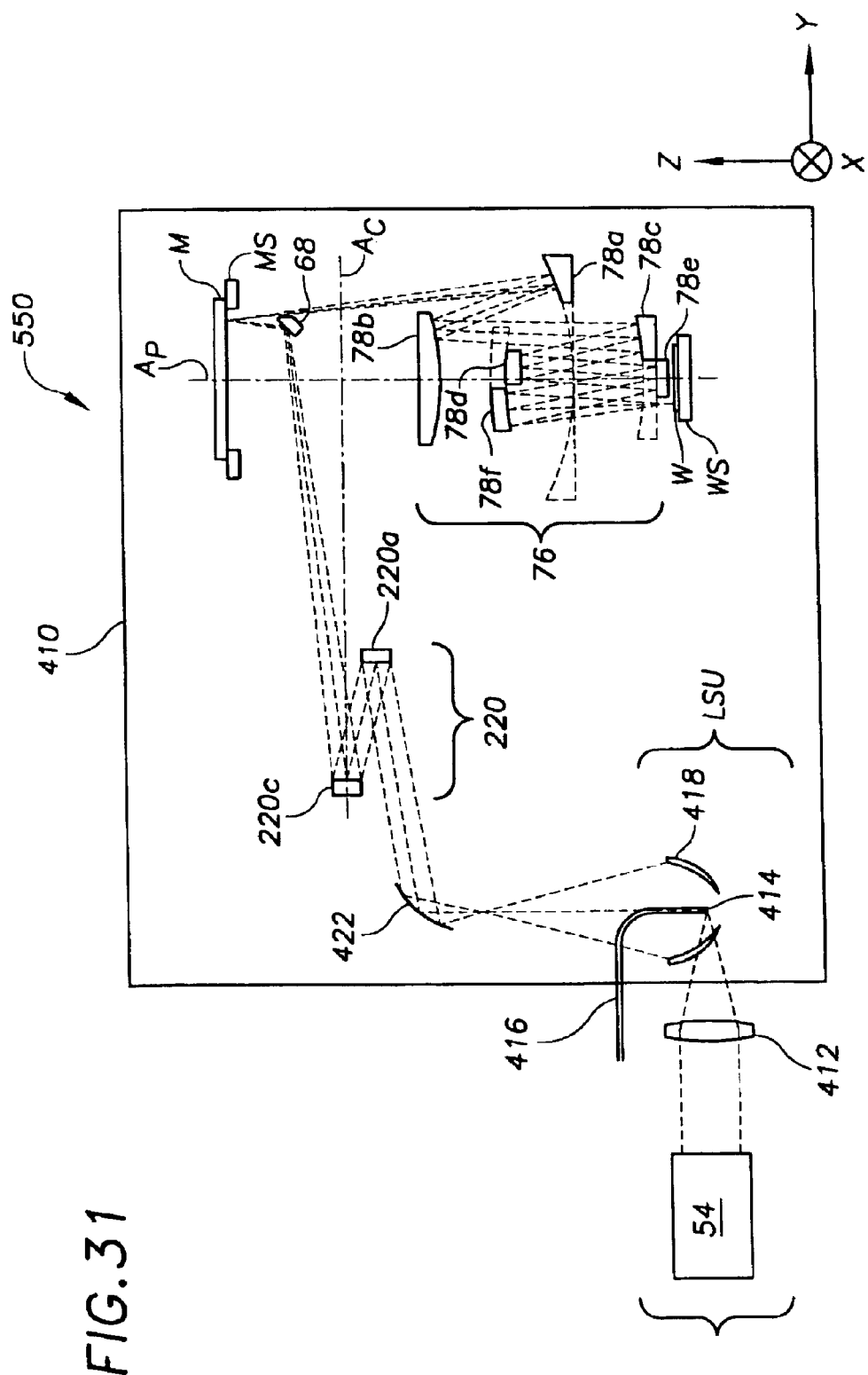
FIG. 31 is a fourth alternate embodiment of the exposure apparatus of FIG. 4, wherein the function of the condenser mirror is combined into the second reflecting element group of the optical integrator.
Figure 32:
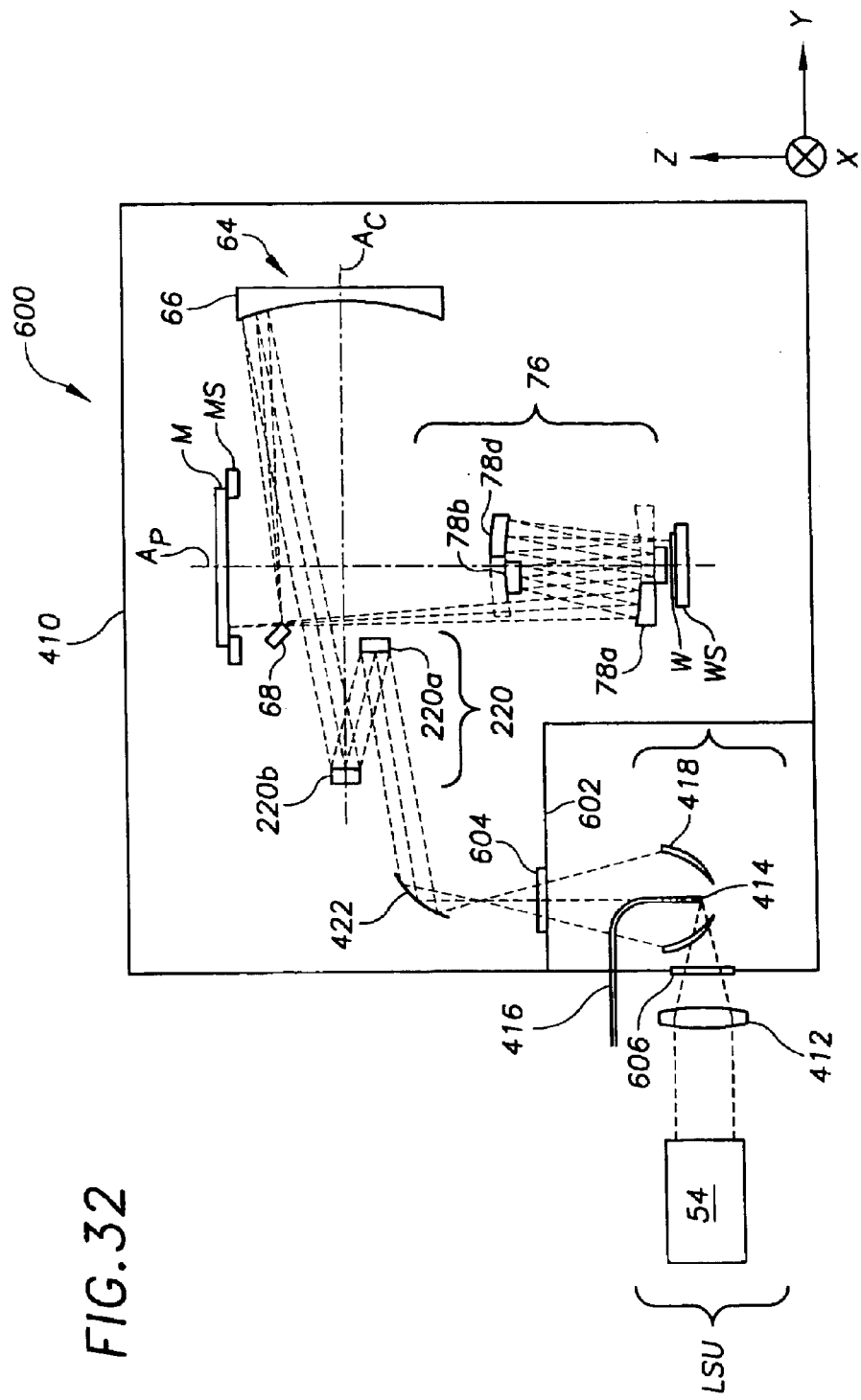
FIG. 32 is a fifth alternate embodiment of the exposure apparatus of FIG. 4, further including a subchamber with a filter for passing X-rays and not dust particles.

The difference between exposure apparatus 400 shown and exposure apparatus 500 of FIG. 28 is that the latter includes an auxiliary optical integrator 510. With reference also to FIGS. 29 and 30, auxiliary optical integrator 510 includes a first auxiliary reflecting element group 510*a* and a second auxiliary reflecting element group 510*b*. Exposure apparatus 500 further includes a relay mirror 514 as a relay optical system. Optical integrator 510 and mirror 514 are respectively arranged in the optical path between reflecting mirror 422 and optical integrator 220. Auxiliary optical integrator 510 is preferably a catoptric fly's eye system. If viewed in order from light source 54, auxiliary optical integrator 510 can be seen as a first optical integrator (i.e., first multiple light source forming optical system), and in combination with a second or main optical integrator 220.

First auxiliary reflecting element group 510*a* comprises a plurality of reflecting elements $E_{510a}$ (FIG. 29) arranged on the entrance side 510*ae* of auxiliary optical integrator 120. Elements $E_{510a}$ are preferably formed in a shape similar to the overall shape (outline) of first reflecting element group 220*a* arranged on the entrance side of optical integrator 220 (see FIGS. 14 and 22). However, if reflecting elements $E_{50a}$ are constituted in a shape as shown in FIGS. 14 and 22, it is difficult to densely arrange the reflecting elements without gaps in between. Consequently, with reference to FIGS. 29 and 30, each of the reflecting elements $E_{510a}$ in first auxiliary reflecting element group 510*a* is nearly square in shape. Now, the cross section of light beam 428 incident first auxiliary reflecting element group 510*a* is nearly circular, and reflecting elements $E_{510a}$ are arranged in a row so that the overall shape (outline) of this group is nearly circular. As a result, first auxiliary reflecting element group 510*a* can form numerous light source images (secondary light sources) with high illumination efficiency at the position of second auxiliary reflecting element group 510*b*, or in the vicinity thereof.

The overall shape (outline) of second auxiliary reflecting element group 510*b* arranged on the exit side of auxiliary optical integrator 510 is preferably formed in a similar shape to that of reflecting elements $E_2$ comprising second reflecting element group 220*b* arranged on the exit side of optical integrator 220, as shown in FIGS. 15 and 23. Each reflecting element $E_{510b}$ in second auxiliary reflecting element group 510*b* is preferably shaped similar to the shape of the light source images formed by reflecting elements $E_{510a}$ in first auxiliary reflecting element group 510*a* so that it receives all the light source images.

In exposure apparatus 500, main optical integrator 220 preferably comprises first and second reflecting element groups 360*a* and 360*b* (FIGS. 22 and 23) in place of reflecting element groups 220*a* and 220*b* (both reference numbers being used hereinafter to indicate either can be used for the first and second reflecting element groups of main optical integrator 220). Consequently, plurality of reflecting elements $E_2$ in second reflecting element group 360*b* (220*b*) arranged on the exit side of optical integrator 220 have a shape that is nearly square, as shown in FIG. 23.

With continuing reference to FIG. 28, the light source images (not shown) formed by each of the plurality of reflecting elements $E_{510a}$ comprising first auxiliary reflecting element group 510*a* in auxiliary optical integrator 510 are nearly circular. Thus, the shape of each reflecting element $E_{510b}$ of second auxiliary reflecting element group 510*b* is nearly square, as shown in FIG. 30. In addition, since the shape of each reflecting element $E_2$ that comprises second reflecting element group 360*b* (220*b*) arranged on the exit side of main optical integrator 220 is nearly square, the reflecting elements therein are arranged in rows so that the overall shape (outline) of second auxiliary reflecting element group 510*b* is nearly square, as shown in FIG. 30.

In this manner, in exposure apparatus 500 of FIG. 28, first and second auxiliary reflecting element groups 510*a* and 510*b* are preferably constituted by the same type of reflecting element group. This allows manufacturing costs to be controlled.

It is also preferable that second reflecting element group 220*b* and condenser mirror 66 satisfy the relation in condition (2), discussed above.

With continuing reference to FIG. 28, the action of optical integrators 220 and 510 are now explained in more detail. By the arrangement of optical integrators 220 and 510, a plurality of light source images (not shown) are formed. The number of light source images corresponds to the product of the number (N) of reflecting elements in one of the reflecting element groups in optical integrator 510 and the number (M) of reflecting elements in one of the reflecting element groups in main optical integrator 220. The plurality of light source images are formed on the surface of one of the second reflecting element groups 360*b* (220*b*) in main optical integrator 220, or in the vicinity thereof. Accordingly, many more light source images (tertiary light sources, not shown) than the light source images (secondary light sources) formed by auxiliary optical integrator 510 are formed on the surface of main reflecting element group 360*b* (220*b*), or in the vicinity thereof. Light from the tertiary light sources from main optical integrator 220 arcuately illuminate mask M in a superimposed manner. Thus, the illumination distribution in arcuate illumination field IF formed on mask M and arcuate image field IF' formed on wafer W can be rendered more uniform, allowing for a much more stable exposure.

Relay mirror 514 arranged between optical integrators 510 and 220 condenses light beam 520 from the numerous light source images (secondary light sources) from optical integrator 510, thereby forming a light beam 522 directed to optical integrator 220. Relay mirror 514 serves the function of making the near surface (i.e., entrance side 510ae) of reflecting element group 510a and the near surface (i.e., entrance side 220ae) of the reflecting element group 220a (360a) optically conjugate. Relay mirror 514 also serves the function of making the near surface (i.e., exit side 510be) of reflecting element group 510b and the near surface (i.e., exit side 220be) of the reflecting element group 360b (220b) optically conjugate. Surface 510ae and surface 220ae are optically conjugate mask M and wafer W. Also, surface 220be and surface 510be are optically conjugate the pupil of projection optical system 76 and the position of aperture stop AS2.

With continuing reference to FIG. 28 and exposure apparatus 500, if the illumination intensity distribution in arcuate illumination field IF is biased, it is preferable to move auxiliary optical integrator 510 (i.e., move reflecting element groups 510a and 510b as a unit). If reflecting element groups 360a (220a) and 360b (220b) in main optical integrator 220 are made eccentric in the X-direction or Z-direction, the biased component of the illumination intensity distribution can be corrected and a uniform illumination intensity distribution can be obtained by the action of coma generated by main optical integrator 220.

For example, if bias occurs in the illumination intensity distribution in the lateral direction (X-direction) of arcuate illumination field IF or in arcuate image field IF', respectively, the bias can be corrected by moving optical integrator 510 in the X-direction. In addition, if the illumination intensity differs between the center part and peripheral part in the width direction of the arcuate illumination field IF or arcuate image field IF', the bias in the illumination intensity distribution can be corrected by moving auxiliary optical integrator 510 in the same direction.

For exposure apparatus 500 to properly form an image of mask M on wafer W, it is preferable to form a well-corrected image of the exit pupil of the illumination system at the center of the entrance pupil of projection optical system 76 (i.e., an image of tertiary light sources formed by optical integrator 220). If this condition is not satisfied, it is preferable to move the position of the exit pupil of the illumination system, to adjust the telecentricity of the illumination system, and to coordinate with the position of the entrance pupil of projection optical system 76. For example, by moving main optical integrator 220 (i.e., two reflecting element groups 360a (220a) and 360b (220b)) and first aperture stop AS1 as a unit, the telecentricity of the illumination system is adjusted, and the center of the exit pupil image of the illumination system is made to coincide with the center of the entrance pupil of projection optical system 76. However, if it is not necessary to provide aperture stop AS1 at the position of the tertiary light sources, then reflecting element groups 360a (220a) and 360b (220b) in main optical integrator 220 are preferably moved as a unit.

In exposure apparatus 400 (FIG. 25) and exposure apparatus 450 (FIG. 26), discussed above, to match the image of the exit pupil of the illumination system to the center of the entrance pupil of projection optical system 76, the center of the exit pupil image of the illumination system can be made to coincide with the center of the entrance pupil of projection optical system 76 by moving optical integrator 220 and first aperture stop AS1 as a unit. If it is not necessary to provide aperture stop AS1 at the position of the secondary light sources, then reflecting element groups 360a (220a) and 360b (220b) are preferably moved as a unit.

In exposure apparatus 400 (FIG. 25), 450 (FIG. 26) and 500 (FIG. 28), discussed above, light source unit LSU in practice generally occupies a considerable volume. It is a possibility that this volume can become equal to or larger than the exposure apparatus body unit (optical system and control system from optical integrator 220 to wafer stage WS). Consequently, it may be preferred to separate light source unit LSU and the exposure apparatus body unit, with light source unit LSU and the exposure apparatus body unit installed independently on a base. In this case, strain in the floor may occur due to, for example, vibration of the floor caused by people near the apparatus, or due to the weight of the light source unit and the exposure apparatus body unit themselves. Thus, there is a risk that the light source unit optical axes ($A_{L1}$ and $A_{L2}$) and the optical system axis (e.g., axis $A_P$ or $A_C$) in the exposure apparatus body unit will become displaced, upsetting the adjustment state of the exposure apparatus.

Accordingly, with reference to FIG. 28, it is preferable to arrange a photoelectric detector 528 in the optical path of the exposure apparatus body unit (i.e., in the optical path from optical integrator 220 to wafer stage WS). Photodetector 528 photoelectrically detects a relative displacement of light source unit optical axis $A_{L1}$ and/or $A_{L2}$, and provides a control signal to a detector control unit 530 that is operably connected to and controls the inclination of collimating mirror 422. Consequently, even if vibration of the floor due to walking and the like of operators or strain in the floor occurs, at least one of light source unit optical axes $A_{L1}$ and $A_{L2}$ and an optical axis (e.g., optical axis $A_P$ or $A_C$) of the optical system inside the exposure apparatus body unit can be aligned automatically.

Because it is difficult to obtain high reflectance for soft X-ray mirrors, it is desirable to reduce the number of mirrors in the optical system of a soft X-ray exposure apparatus. One technique to reduce the number of mirrors in the present invention involves eliminating condenser mirror 66. This is achieved by bending the entirety of one of second reflecting element group 360b (220b) in optical integrator 220 (FIG. 15 and FIG. 23). In other words, by constituting second reflecting element group 360b (220b) by arranging in a row numerous reflecting elements $E_2$ within a reference spherical surface (reference curved surface) having a predetermined curvature, the function of condenser mirror 66 can be incorporated into second reflecting element group 360b (220b). Thus, with reference now to FIG. 31, and exposure apparatus 550 and also to FIG. 21, a second reflective element group 220c combines the function of condenser mirror 66 in one of second reflecting element group 360b (220b) in optical integrator 220. By modifying the configuration of second reflecting element group 360b (220b) of main optical integrator 220 of exposure apparatus 500 (FIG. 28), the function of condenser mirror 66 can be combined therein as well. Projection optical system 76 in FIG. 31 comprises six mirrors 78a–78f to still further improve imaging performance.

Exposure apparatus 400 to 550 of the present invention preferably use a laser plasma light source. However, such a light source has the disadvantage of generating a spray of microscopic matter. If optical parts are contaminated by this fine spray, the performance of the optical system, which is based in part on mirror reflectance and reflection uniformity, deteriorates. Thus, with reference to FIG. 32 and exposure apparatus 600, it is preferable to arrange, with vacuum chamber 410, a sub-chamber 602 which houses a portion of nozzle 416, and elliptical mirror 418. Chamber 602 includes a filter window 604 capable of transmitting only soft X-rays while blocking transmission of the dispersed microscopic particles. A thin film of a light element (i.e., a membrane) may be used as filter 604. In the present arrangement, vacuum chamber 410 also includes a second window 606 capable of passing light from light source 54 into chamber 602. This arrangement may be used with any of exposure apparatus 400–550 of the present invention as well.

If filter 604 is provided between elliptical mirror 418 and collimator collimating mirror 422, operating costs can be kept low by replacing elliptical mirror 418 and filter 604 when contamination occurs.

Exposure apparatus 400–600 are enclosed in vacuum chamber 410, since the transmittance of soft X-rays through the atmosphere is relatively low. Nevertheless, it is difficult for the heat remaining in the optical parts to escape. As a result, the mirror surfaces tend to warp. Accordingly, it is preferable to provide a cooling mechanism (not shown) for each of the optical parts inside vacuum chamber 410. More preferably, if a plurality of cooling mechanisms is attached to each mirror and the temperature distribution inside the mirror controlled, then warping of the mirrors during the exposure operation can be further controlled.

In addition, a multilayer film is provided on the reflecting surfaces in exposure apparatus 400–600. It is preferable that this multilayer film be formed by layering a plurality of materials from among molybdenum, lithium, rhodium, silicon and silicon oxide.

As is apparent from the above description, the present invention has many advantages. A first advantage of the present invention is that a surface of an object, such as a mask surface, can be illuminated uniformly and efficiently over an arcuately shaped illumination field while maintaining a nearly fixed numerical aperture of the illumination light. A second advantage is that the illumination coherence can be varied to suit the particular pattern on the mask to be imaged onto the wafer by varying the size of the aperture stops in the illuminator and in the projection optical system. A third advantage is that the illumination beam can be altered through the use of an adjustable annular light beam converting unit. A fourth advantage is that one of a plurality of aperture stops can be inserted into the illumination system to alter the illumination coherence. A fifth advantage is that a bias in the illumination uniformity can be compensated by measuring the light beam uniformity and adjusting the collimating mirror in the illuminator based on the uniformity measurement.

While the present invention has been described in connection with preferred embodiments, it will be understood that it is not so limited. On the contrary, it is intended to cover all alternatives, modifications and equivalents as may be included within the spirit and scope of the invention as defined in the appended claims.

What is claimed is:

1. An optical apparatus for guiding EUV radiation to a predetermined surface, comprising:
    a radiation source which supplies EUV radiation;
    an illumination optical system having a reflective integrator which forms a secondary radiation source having a predetermined shape based on the EUV radiation supplied from the radiation source; and
    a projection optical system which is arranged in an optical path between a reflective mask and the predetermined surface and which forms an image of the reflective mask onto the predetermined surface based on the EUV radiation from the reflective mask,
    wherein the secondary radiation source having the predetermined shape has a shape which is adjustable.

2. The optical apparatus of claim 1, wherein a numerical aperture of the projection optical system is changeable.

3. The optical apparatus of claim 2, wherein a numerical aperture of the illumination optical system is changeable.

4. The optical apparatus of claim 3, further comprising an annular radiation beam converting unit which is arranged in an optical path between the radiation source and the reflective integrator.

5. The optical apparatus of claim 3, further comprising a multipolar radiation beam converting unit which is arranged in an optical path between the radiation source and the reflective integrator.

6. The optical apparatus of claim 5, wherein the multipolar shape comprises a quadrupolar shape.

7. The optical apparatus of claim 3, further comprising a unit that changes a radiation beam which is incident on the reflective integrator.

8. The optical apparatus of claim 3, wherein the projection optical system comprises six mirrors.

9. The optical apparatus of claim 1, wherein the secondary radiation source having the predetermined shape is changed based on information about the reflective mask.

10. The optical apparatus of claim 1, wherein the illumination optical system and the projection optical system are mask side non-telecentric.

11. A method of guiding EUV radiation to a predetermined surface, comprising the steps of:
    supplying EUV radiation;
    forming a secondary radiation source having a predetermined shape using a reflective integrator, based on the supplied EUV radiation;
    guiding the EUV radiation from the reflective integrator to a reflective mask;
    forming an image of the reflective mask using a projection optical system based on the EUV radiation from the reflective mask; and
    adjusting a shape of the secondary radiation source.

12. The method of claim 11, further comprising the step of changing a coherence factor.

13. The method of claim 11, further comprising the step of converting the supplied EUV radiation to an annular beam.

14. The method of claim 13, wherein the converting step is performed before guiding the supplied EUV radiation to the reflective integrator.

15. The method of claim 11, further comprising the step of converting the supplied EUV radiation to a multipolar beam.

16. The method of claim 15, wherein the converting step is performed before guiding the supplied EUV radiation to the reflective integrator.

17. The method of claim 16, wherein the multipolar shape comprises a quadrupolar shape.

18. The method of claim 11, wherein the adjusting step changes the shape of the secondary radiation source based on information about the reflective mask.

19. The optical apparatus of claim 3, wherein the predetermined shape of the secondary radiation source has a shape which is selected from the group consisting of a substantially circular shape, an annular shape, and a multipolar shape.

20. The method of claim 12, wherein the adjusting step selects a shape of the secondary radiation source from the group consisting of a substantially round shape, an annular shape, and a multipolar shape.

* * * * *